United States Patent [19]

Shimogori et al.

[11] Patent Number: 4,963,440
[45] Date of Patent: Oct. 16, 1990

[54] AL-CR ALLOY VAPOR-DEPOSITED MATERIAL

[75] Inventors: Kazutoshi Shimogori; Hiroshi Satoh, both of Kobe; Masao Toyama, Mino; Hidetoshi Nishimoto, Miki; Koki Ikeda, Kobe; Junji Kawafuku, Kobe, all of Japan

[73] Assignee: Kabushiki Kaisha Kobe Seiko Sho, Kobe, Japan

[21] Appl. No.: 298,894

[22] Filed: Jan. 19, 1989

[30] Foreign Application Priority Data

| Jul. 9, 1987 | [JP] | Japan | 62-171661 |
| Jul. 9, 1987 | [JP] | Japan | 62-171659 |
| Jul. 9, 1987 | [JP] | Japan | 62-171660 |
| Jul. 15, 1987 | [JP] | Japan | 62-177832 |
| Jul. 15, 1987 | [JP] | Japan | 62-177829 |
| Jul. 15, 1987 | [JP] | Japan | 62-177830 |
| Jul. 15, 1987 | [JP] | Japan | 62-177831 |
| Oct. 8, 1987 | [JP] | Japan | 62-255493 |
| Nov. 9, 1987 | [JP] | Japan | 62-282827 |
| Jan. 20, 1988 | [JP] | Japan | 63-11650 |

[51] Int. Cl.[5] ............................................. B32B 15/01
[52] U.S. Cl. ........................ 428/651; 428/610; 428/641; 428/653; 428/666; 428/667; 428/674; 428/677
[58] Field of Search ............... 428/651, 652, 653, 654, 428/610, 641, 666, 667, 674, 675, 676, 677

[56] References Cited

U.S. PATENT DOCUMENTS

| 3,567,409 | 3/1971 | Seiler ............................. 428/653 |
| 3,649,225 | 3/1972 | Simmons, Jr. ................... 428/651 |
| 3,656,919 | 4/1972 | Lucas et al. ..................... 428/651 |

OTHER PUBLICATIONS

*American Heritage Dictionary of the English Language*; William Morris, Editor, Houghton Mifflin Co.: Boston (1981), p. 485.

Primary Examiner—Theodore Morris
Assistant Examiner—Robert Koehler
Attorney, Agent, or Firm—Oblon, Spivak, McClelland, Maier & Neustadt

[57] ABSTRACT

Provided herein is an Al-Cr alloy vapor deposited product having high corrosion resistance which can be used under a corrosive environment for a long period of time on account of the outstanding corrosion resistance and heat resistance of the Al-Cr alloy vapor deposited layer.

15 Claims, 12 Drawing Sheets

AL-CR ALLOY VAPOR-DEPOSITED MATERIAL

BACKGROUND OF THE INVENTION

1. Field of the Invention:

The present invention relates to an Al-Cr alloy vapor-deposited material which will find use in the application area of plated products such as automotive exhaust mufflers, stove heat reflectors, constituents of waste incinerator, and building materials, which need high corrosion resistance because they are used at high temperatures in a highly corrosive environment. More particularly, it is concerned with an Al-Cr alloy vapor-deposited material which has not only outstanding corrosion resistance but also good overall durability in a high-temperature, corrosive environment on account of its ability to withstand the exfoliation of metallic deposit even when heated for a long period of time.

Among the substrate metals for the Al-Cr vapor-deposited material of the present invention are iron, steel, alloy steel, aluminum, aluminum alloy, copper, copper alloy, titanium, titanium alloy, etc. in the form of plate, rod, pipe, corrugated sheet, and L- or H-section. This specification will be concerned mainly with steel sheets which are most typical among the metallic materials listed above.

2. Description of the Prior Art:

Corrosion resistance at high temperatures is the most important characteristic property required for automotive exhaust mufflers, reflectors of kerosene stoves and gas stoves, and components of waste incinerators, which are exposed to a high-temperature, corrosive environment. Stainless steel has been generally used in these application areas on account of its outstanding corrosion resistance at high temperatures. Recently, stainless steel is being replaced by aluminized steel which is comparatively inexpensive. Aluminized steel is greatly improved in corrosion resistance at high temperature over unplated steel on account of the surface protection provided by aluminum having superior oxidation resistance and corrosion resistance.

Unfortunately, aluminized steel has the disadvantage that when it is exposed to a high-temperature environment where chloride ions exist, the passivation film, which is composed mainly of aluminum oxide and is formed on the deposit surface, is destroyed comparatively easily, with the result that pitting takes place and rust composed mainly of $Al(OH)_3$ as a corrosion product occurs on the deposit surface. As the pitting proceeds further, penetration pits occur, causing the substrate steel sheet to be exposed, and the substrate steel sheet is subject to rapid corrosion with red rust. Another disadvantage of aluminized steel is that the aluminum deposit easily dissolves even in a weak acidic environment, losing its effect of surface protection. Therefore, aluminized steel is not so good in corrosion resistance as expected when used for parts which are exposed to a complex corrosive environment.

Studies are being made to overcome these disadvantages of aluminized steel by alloying aluminum with Zn or Mg for improved corrosion resistance. However, alloying is not so effective in improving corrosion resistance for the reasons give below.

(1) The alloying metal is limited in its amount to be added because it adversely affects the formability of aluminum.

(2) The hot dip aluminizing process to form the aluminum deposit or aluminum alloy deposit does not permit the alloying metal to be dissolved in the molten aluminum bath infinitely.

Another disadvantage of the hot dip aluminizing process is that the dipping of steel in a molten aluminum bath, during which the surface temperature of steel reaches about 700° C., forms Fe-Al intermetallic compounds such as $Fe_2Al_5$ at the interface between steel and aluminum deposit. Being brittle and poor in formability, these intermetallic compounds cause exfoliation when the aluminized steel undergoes intensive forming such as bending.

The formation of Fe-Al intermetallic compounds at the interface between the deposit layer and the substrate metal at the time of plating may be suppressed to some extent by adding about 9% of Si to the molten aluminum bath. The silicon thus added also provides heat resistance, that is, it prevents Fe-Al intermetallic compounds from occurring when the aluminized steel is used at high temperatures, especially above 400° C. However, the effect of silicon is not necessarily satisfactory.

Attempts are being made to provide aluminized steel sheets with improved heat resistance that can be used at high temperatures above 700° C., by replacing the substrate steel with extremely low carbon Cr-Ti killed steel or Cr-Cu killed steel. Even such special killed steels do not completely prevent the formation of Fe-Al intermetallic compounds at the interface between the deposit layer and the substrate steel sheet so long as the hot-dip plating is employed. Therefore, the resulting aluminized steel sheets are not satisfactory in formability. In addition, the above-mentioned special killed steels are more expensive than ordinary Al killed steels, and this offsets the economical advantage of aluminized steel sheets.

Al-Si alloy-plated steel sheets are slightly inferior in corrosion resistance to pure Al-plated steel sheets; therefore, the former is not considered to be superior in overall properties. A common practice to overcome this disadvantage is to provide the surface of Al-Si alloy-plate steel sheets with a thin protective film by chemical conversion such as chromate treatment. This practice, however, is not satisfactory for the improvement of corrosion resistance, because once the protective film is broken or lost by corrosion, the Al-Si deposit layer with insufficient corrosion resistance is subject to corrosion.

Among other plating methods is electroplating. Electroplating is commonly used for electrolytic galavanized steel sheets; but it cannot perform the electrodeposition of aluminum or aluminum alloy on a steel sheet from an aqueous solution. Although electroplating from a non-aqueous solution is basically possible, it is low in efficiency on account of the very low current density at the time of electrodeposition. In addition, the non-aqueous solution for plating is electrically unstable. For these reasons, electroplating is not suitable for the plating of aluminum or aluminum alloy in industrial use.

SUMMARY OF THE INVENTION

The present invention was completed with the foregoing in mind. It is an object of the present invention to provide an aluminum alloy-deposited product which exhibits outstanding corrosion resistance in a severe corrosive environment where halogenide ions and acidic gases exist at high temperatures. It is another object of the present invention to provide an aluminum alloy-deposited product which exhibits not only the above-mentioned good corrosion resistance at high temperatures but also outstanding heat resistance and formability owing to its ability to prevent the formation of brittle Fe-Al intermetallic compounds at the time of plating or during its use at high temperatures.

The present inventors attempted to make a variety of aluminum alloy-deposited products for the purpose of improving the corrosion resistance of aluminum alloy-deposited products. As the result, it was found that Al-Cr alloy-deposited products exhibit high corrosion resistance.

The Al-Cr alloy-deposited product pertaining to the present invention has the Al-Cr alloy deposit layer which is described in the following. The Al-Cr alloy deposit layer produces its effect however small the Cr content might be in the alloy. With the Cr content at least 1%, the Al-Cr alloy deposit layer exhibits a greatly improved corrosion resistance. (See FIGS. 1 and 2.) By contrast, with the Cr content in excess of 50% in the case where the substrate metal is an electrochemically less noble metal such as steel, aluminum, and aluminum alloy, the Al-Cr alloy deposit layer is so poor in sacrificial corrosion protection that the substrate metal is subject to corrosion through pinholes, because the alloy deposit layer has a higher potential than the substrate metal in such a case. (See FIG. 3.) Therefore, the content of Cr in the Al-Cr alloy deposit layer should be in the range of from 1 to 50%.

The deposit layer should preferably have a thickness greater than 0.1 $\mu$m. With a thickness smaller than 0.1 $\mu$m, the deposit layer does not cover the surface of the substrate metal completely and hence does not exhibit the significant corrosion resistance on account of pinholes therein. With a thickness greater than 0.1 $\mu$m, the deposit layer exhibits the complete corrosion resistance. (See FIG. 4.)

Although there are several possible ways to form the deposit layer, such as hot dipping, electroplating, chemical plating, and vapor deposition, it is necessary to adopt the vapor deposition method if the Al-Cr alloy-deposited product with high corrosion resistance is to be obtained according to the present invention. This is because other methods have their respective disadvantages as mentioned below.

A disadvantage of hot dipping is that the bath temperature has to be increased to dissolve Cr in molten aluminum. Hot dipping at a high temperature forms a thick layer of intermetallic compounds such as $Fe_2Al_5$, resulting in poor formability, in the case where the substrate metal is steel. In addition, hot dipping limits the amount of Cr that can be added to molten aluminum. This leads to the limitation of the composition of the Al-Cr alloy deposit.

A disadvantage of electroplating and chemical plating is that it is impossible to deposit the Al-Cr alloy from an aqueous solution. Although deposition from a non-aqueous solution is basically possible, it is poor in efficiency on account of a low current density. Another disadvantage is that the plating solution is unstable and the production cost is high.

By contrast, vapor deposition permits the composition of the Al-Cr alloy deposit to be changed comparatively easily as desired. The desired composition is obtained by adjusting the vapor amount of Al and Cr placed in respective vessels with controlled heating. No deposit of intended composition is obtained by the simple heating of an Al-Cr mixture or alloy, because Al and Cr have different vapor pressures when vaporized in a vacuum.

The above-foregoing is concerned with the process for forming a vapor deposit layer of an Al-Cr alloy directly on a substrate steel sheet. It is also possible to form an Al-Cr alloy layer on a substrate steel sheet by the steps of forming a Cr (or Al) vapor deposit layer on a substrate steel sheet, forming an Al (or Cr) vapor deposit layer on the Cr (or Al) vapor deposit layer, and performing heat treatment at a proper temperature, thereby causing Al and Cr to diffuse into each other.

The Al-Cr alloy vapor-deposited steel sheet should be produced in a vacuum chamber kept at a pressure lower than $10^{-2}$ Torr, preferably lower than $10^{-3}$ Torr. With a pressure higher than $10^{-2}$ Torr in the vacuum chamber, the Al and Cr vapors are oxidized by residual air. This results in the Al-Cr deposit in partly oxidized state. It is liable to cause cracking and peeling at the time of forming, and the resulting product does not exhibit its inherent performance. (See Tables 1 and 2.)

The vapor deposition process pertaining to the present invention embraces the so-called ion plating process. According to the ion plating process, Al and Cr are vaporized, their vapors are cationized by the application of high frequency, and the cationized vapors are deposited on a substrate metal which is negatively charged. The ion plating provides an improved adhesion between the substrate metal and the deposit layer and also produces the fine crystals of deposited metal, which leads to a decrease in pinholes.

In the meantime, the Al-Cr alloy has outstanding corrosion resistance among binary aluminum alloys; and there is hardly a possibility that the corrosion resistance is further improved by replacing Cr with any other alloying metal. In search of a product having better corrosion resistance, the present inventors investigated into ternary aluminum alloys formed by adding a third alloying metal to the above-mentioned Al-Cr alloy. The ternary alloy was deposited on a substrate metal, especially steel sheet, by the vapor deposition process, and the resulting deposited steel sheet was examined for corrosion resistance. As the result, it was found that ternary alloys containing Ti or Si as a third alloying metal are superior to the Al-Cr binary alloys in corrosion resistance at high temperatures. These ternary aluminum alloys owe their high corrosion resistance not only to the fundamental properties of the Al-Cr alloy but also to the third alloying metal which produces the desired effect in concert with the binary alloys.

DESCRIPTION OF THE PREFERRED EMBODIMENTS

Figure 1:
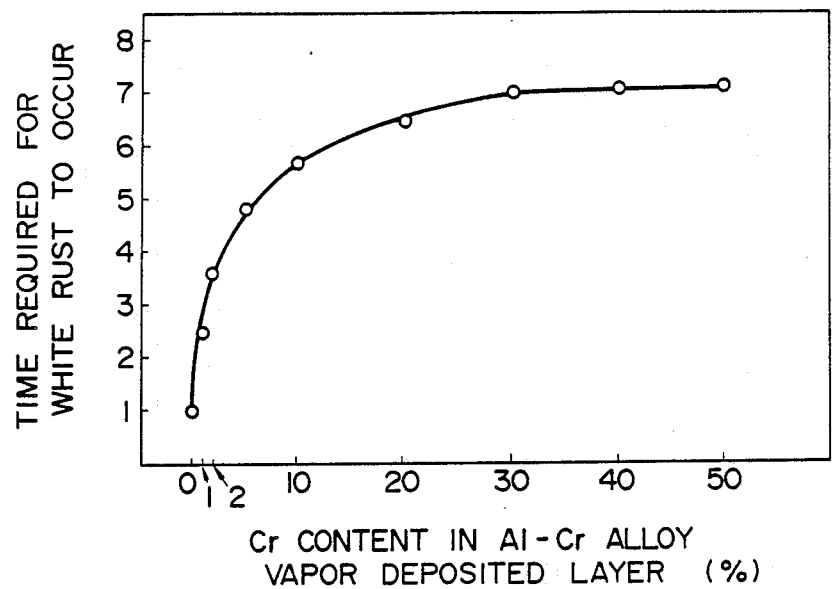
FIG. 1 is a graph showing the relation between the Cr content in the Al-Cr alloy deposit layer and the time required for white rust to occur.

The Al-Cr alloy vapor-deposited products pertaining to the present invention exhibits satisfactory corrosion resistance so long as the Al-Cr alloy deposit layer contains Cr in an amount from 1 to 50%, as mentioned above. The Al-Cr deposit layer should preferably contain Cr in an amount from 1 to 30%. In addition, it should preferably have a structure which gives the main peaks of Al, Cr, and $Al_{13}Cr_2$ ($\theta$ phase) in the X-ray diffraction pattern (Cu-K$\alpha$ rays). The Al-Cr deposit layer with such a structure provides good corrosion resistance. With the Cr content more than 1%, the deposit layer exhibits good corrosion resistance. The higher the Cr content, the better the corrosion resistance. With the Cr content of 20 to 30%, the Al-Cr deposit layer exhibits the maximum corrosion resistance, and additional Cr does not improve the corrosion resistance any more. Increasing the Cr content haphazardly leads to a high production cost and economical disadvantage, because Cr is more expensive than Al and Cr needs more energy for evaporation than Al on account of its lower equilibrium vapor pressure. Thus, the Cr content in the vapor-deposited layer should preferably be 1 to 30%.

Studies on the corrosion resistance of the Al-Cr alloy indicate that corrosion resistance is affected not only by the Cr content but also by the phase structure of the Al-Cr alloy vapor deposited layer. In other words, the best corrosion resistance is achieved in the case where the Al-Cr alloy deposited layer has such a structure that the X-ray diffraction patterns with Cu-K$\alpha$ rays show the main peaks of Al, Cr, and $Al_{13}Cr_2$ ($\theta$ phase). Even though the Cr content is in the range of 1 to 30%, the Al-Cr alloy deposited layer may decrease in corrosion resistance if it has such a structure that the X-ray diffraction patterns show the peaks of the $\eta$ phase ($Al_5Cr$ or $Al_{11}Cr_2$) of the Al-Cr intermetallic compound. The phase structure as mentioned above may be imparted to the vapor deposited layer when the vapor deposition is performed in the following manner.

The Al-Cr alloy deposited layer having the above-mentioned X-ray diffraction pattern can be formed by performing vapor deposition under the following conditions. The substrate metal should be heated to 100° to 450° C., and the vacuum chamber should be evacuated to $10^{-2}$ Torr or below, preferably $10^{-4}$ Torr or below so that the substrate metal and the vaporized metal are protected from oxidation. The Al-Cr alloy deposited layer of desired composition cannot be obtained by the simple evaporation of an Al-Cr mixture or alloy, because Al and Cr have different vapor pressures and Al evaporates more easily than Cr in a vacuum. Thus, it is necessary to place Al and Cr in respective vessels and heat them separately so as to properly control the amount of Al and Cr vapors.

During the vapor deposition, the substrate metal should be kept at a proper temperature. With a heating temperature lower than 100° C., adhesion between the substrate metal and the deposited layer is so poor that the deposited layer is subject to exfoliation. Conversely, with a heating temperature higher than 450° C., brittle Fe-Al intermetallic compounds are liable to occur at the interface between the substrate metal and the deposited layer, in the case where the substrate metal is steel. This intermetallic compound causes the same defects as in the case of conventional hot dip aluminized steel sheets. That is, it causes the deposited layer to peel off at the time of forming. Moreover, if the substrate is heated excessively high, the Al-Cr alloy deposited layer forms intermetallic compounds such as $Al_5Cr$ ($\eta$ phase) and $Al_{11}Cr_2$, even though the Cr content is within the range of 1 to 30%.

The present inventors' studies indicate that it is not always desirable that the Cr content be uniformly distributed across the thickness of the Al-Cr alloy deposited layer. Rather, the content gradation in the deposited layer may contribute to better corrosion resistance. The reason for this is considered as follows: The fact that the Al-Cr alloy deposited layer maintains good corrosion resistance for a long period of time even in a corrosive environment containing chloride ions and acidic substances may be elucidated by assuming that the Al-Cr alloy deposited layer forms on its surface a complex passivation film composed of $Al_2O_3$ and $Cr_2O_3$ which is chemically more stable than a passivation film of $Al_2O_3$ alone, and the former remains to be a strong protective oxide layer even in the presence of halogenide ions and acidic substances. It follows, therefore, that the Cr content in the surface of the deposited layer should be high to some extent from the standpoint of improved corrosion resistance. On the other hand, the deposited layer should contain as much Al as possible from the standpoint of adhesion of the deposited layer to the substrate metal. (Best adhesion is achieved in the case of pure aluminum.) It is considered that aluminum vapor reduces a thin oxide layer on the surface of the substrate metal in the evaporation process, thereby activating the surface of the substrate metal. This surface activation effect becomes insufficient when the deposited layer contains an excess amount of Cr, with the result that the deposited layer becomes poor in adhesion to the substrate metal. For the reasons mentioned above, the Cr content in the deposited layer should be lower in the part close to the substrate metal than in the part close to the surface of the deposited layer. This gradated Cr content increases the adhesion of the deposited layer to the substrate metal and also increases the corrosion resistance in some corrosive environments.

The gradation of the Cr content should be smooth. If the composition of the Al-Cr alloy deposited layer extremely changes with distance across its thickness, there is a possibility that flaking takes place in the deposited layer at the time of forming. This problem will be solved if a proper provision is made so that the Cr content gradually increases continuously or stepwise with distance across the thickness of the deposited layer (from the interface between the substrate metal and the deposited layer to the surface of the deposited layer).

The gradation of the Cr content across the thickness of the deposited layer may be achieved by either of the following two methods.

The first method involves the steps of depositing a metal vapor containing the least amount of Cr (or Al alone) on the substrate steel sheet, and then increasing the amount of Cr vapor, thereby increasing the Cr content in the deposited layer.

Figure 5:
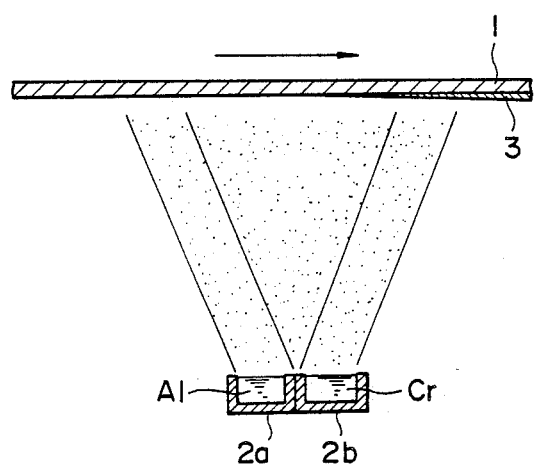
FIG. 5 is a schematic representation showing the Al-Cr alloy depositing process employed in the present invention.

The second method involves the simultaneous evaporation of Al and Cr placed in separate vessels as shown in FIG. 5. In FIG. 5, there are shown a steel sheet 1 running in the direction of the arrow and two crucibles 2a and 2b arranged under the steel sheet 1 and parallel to the running direction, which are all placed in a vacuum chamber (not shown). The crucible 2a (placed upstream) is charged with Al, and the crucible 2b (placed downstream) is charged with Cr. In the depositing operation, Al and Cr are heated for evaporation. The Al and Cr vapors reach the steel sheet 1 along their passages which overlap each other as shown in FIG. 5. The arrangement causes the deposition to takes place such that the mixed vapor containing more Al deposits first on the steel sheet 1 and the mixed vapor containing less and less Al deposits sequentially on the steel sheet 1 and finally the mixed vapor containing the highest amount of Cr deposits on the steel sheet 1 at the most downstream end of the run. As the result, there is formed a deposited layer 3 of Al-Cr alloy in which the Al content increases with distance across the thickness from the surface to the lower part. According to this method, the Cr content in the deposited layer of Al-Cr alloy can be controlled as desired if the pressure in the vacuum chamber and the heating conditions of the two crucibles 2a and 2b are properly adjusted. In addition, the thickness of the deposited layer can be controlled as desired by changing the line speed of the steel sheet 1 and the amount of evaporation of Al and Cr.

Figure 6A:
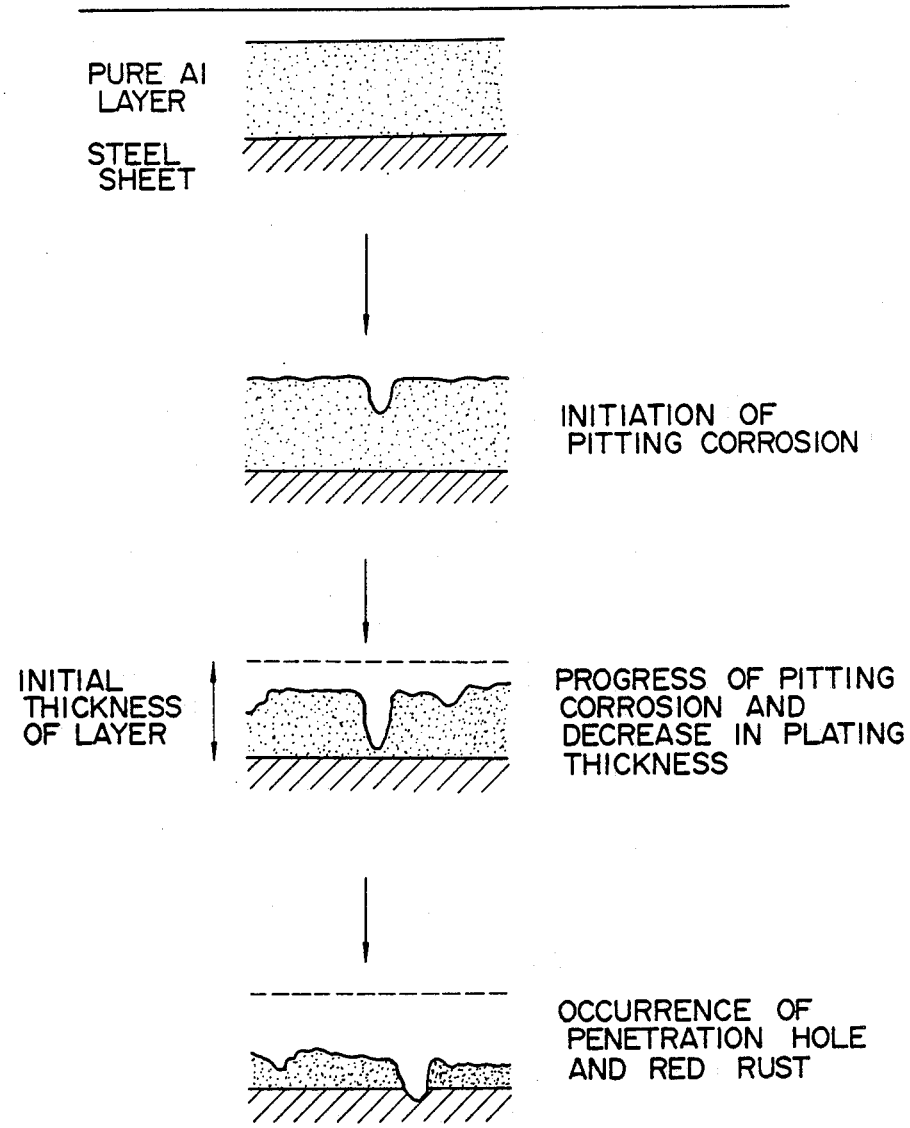
FIGS. 6(a) and 6(b) are schematic representations showing the progress of corrosion.

In the meantime, a conventional aluminized steel sheet is subject to corrosion which proceeds as shown in FIG. 6(a). At first, corrosion starts with the breakage of the thin passivation film on the surface by chloride ions and the like, which is followed by the occurrence of pitting. Pitting induces localized corrosion around pits, and pitting grows into a through hole which reaches the substrate steel sheet, causing red rust to occur. The corrosion that takes place in this manner may be reduced by improving the thin passivation film, and the improvement of the thin passivation film may be effectively achieved by increasing the Cr content in the surface part of the deposited layer. However, this produces an electrochemical potential difference in the deposited layer, which, in turn, causes localized corrosion because the part with a low Cr content is subject to corrosion due to galvanic action. This fact gave the present inventors the idea of utilizing the galvanic action caused by the uneven distribution of Cr content in the deposited layer to prevent the localized corrosion and thereby to improve the corrosion resistance of the Al-Cr alloy deposited material. On the basis of this idea, the present inventors found that it is possible to increase corrosion resistance if the Al-Cr alloy deposited layer is given a gradated Cr content across the thickness, with the highest content being at the part in contact with the substrate metal. This structure is different from the one mentioned above.

The Al-Cr alloy deposited layer constructed just mentioned above undergoes corrosion as shown in FIG. 6(b). As in the case of FIG. 6(a), corrosion starts with the breakage of the thin passivation film on the surface, which is followed by the occurrence of pitting. However, the growth of pitting is suppressed because the Cr content increases with distance across the thickness of the layer. As the pit grows, the electrochemical potential in the pit is shifted toward noble by the alloying metal. Consequently, the surface of the deposited layer, which is electrochemically less noble, becomes an anode and the bottom of the pit becomes a cathode on account of galvanic action. Thus, the surface is more liable to corrosion than the bottom of the pit, and the progress of pitting is prevented.

Figure 6B:
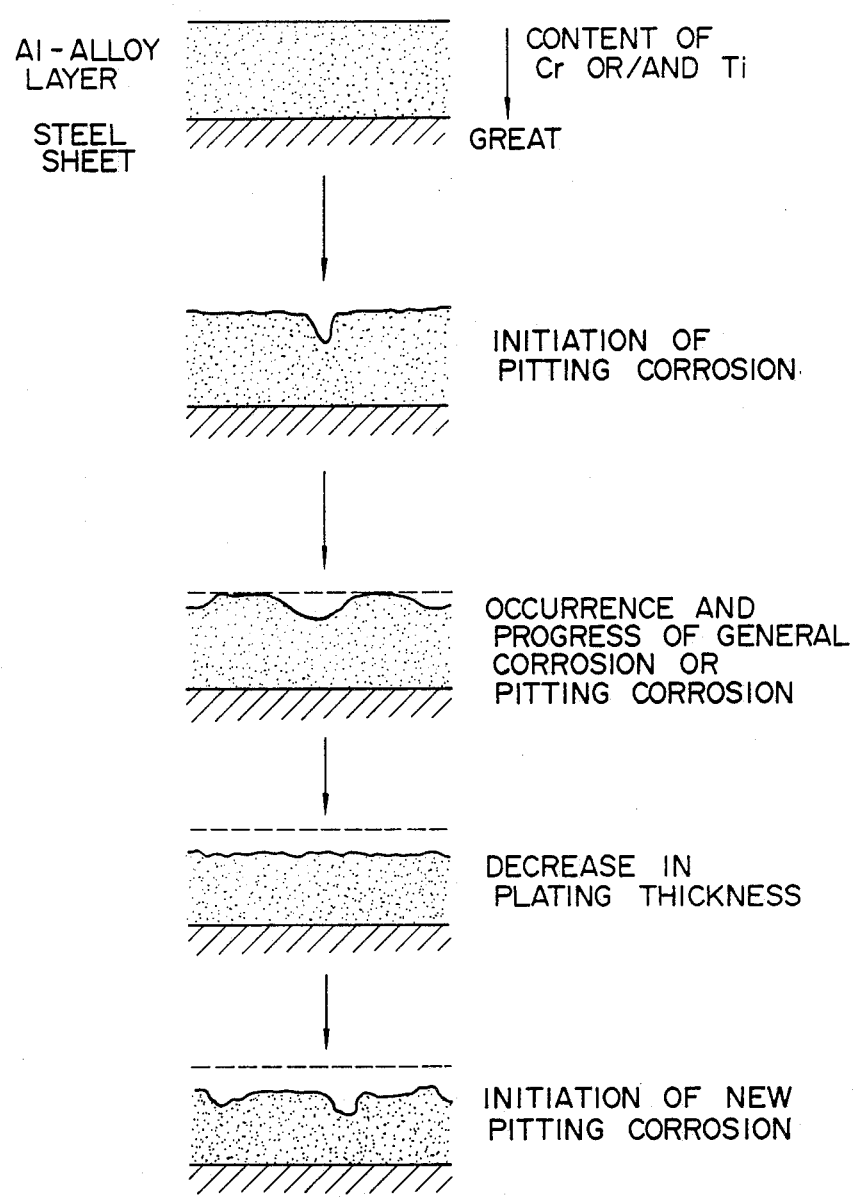

The Al-Cr alloy vapor deposited product of the present invention has such a structure that the potential becomes gradually noble across the thickness from the surface to the bottom. Therefore, even if pitting should occur, corrosion preferentially occurs in the surface, where the potential is less noble, and the progress of pitting is suppressed. As shown in FIG. 6(b), corrosion proceeds all over the surface, and this retards the corrosion that reaches the substrate metal.

The Al-Cr alloy vapor deposited product of the above-mentioned structure has an advantage of being superior in heat resistance. Since it is formed by vapor deposition process, it does not have any layer of brittle Fe-Al intermetallic compounds at the interface between the deposited layer and the substrate steel sheet in as-vapor deposited state. However, there is the possibility that when it is heated for a long time, a layer of Fe-Al intermetallic compounds grows, causing the luster and appearance characteristic of the Al plating to be lost. This possibility is avoided in the Al-Cr alloy vapor deposited product of the present invention, in which the Cr content changes gradually with distance across the thickness of the deposited layer. (In other words, the Cr content is highest at the bottom of the deposited layer and lowest at the surface of the deposited layer.) Cr at the bottom of the deposited layer effectively prevents the formation of Fe-Al intermetallic compounds because of its ability to prevent the mutual diffusion of Al and Fe. Thus, Cr in high concentrations functions as a barrier to prevent diffusion between the deposited layer and the substrate steel sheet. This leads to the good heat resistance of the Al-Cr alloy deposited product. The Al-Cr alloy deposited product with the gradated Cr content can be produced according to the process explained above with reference to FIG. 5.

Figure 7:
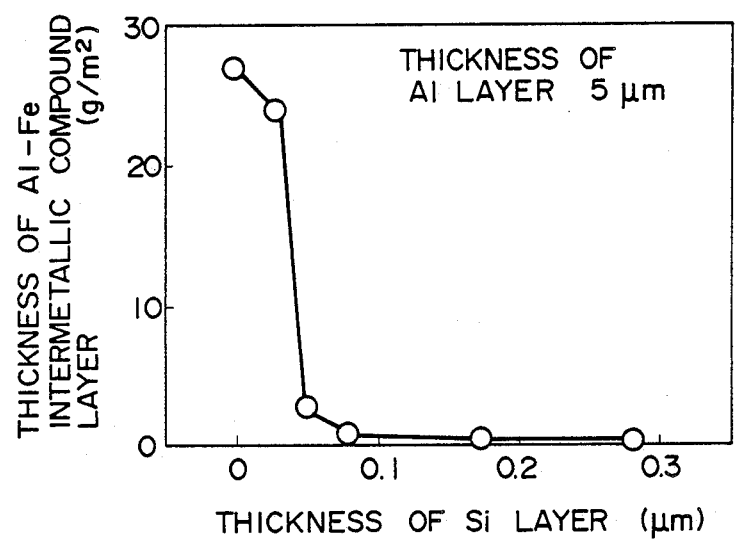
FIG. 7 is a graph showing the relation between the heat resistance and the thickness of the first Si deposit layer in the double-layer deposit structure.

The above-mentioned idea of improving the heat resistance of the Al-Cr alloy deposited product led to another new idea. That is, it was found that it is possible to suppress Fe-Al intermetallic compounds with certainty if a pre-plated layer (strike plated layer) is formed between the Al-Cr alloy deposited layer and the substrate metal. Heretofore, it has been known that the formation of Fe-Al intermetallic compounds in aluminized products can be suppressed by adding about 9% of Si to the molten aluminum bath. This gave the present inventors the idea of preventing the formation of Fe-Al intermetallic compounds by providing the substrate metal with a pretreated layer of Si prior to the deposition of the Al-Cr alloy. In this type of Al-Cr alloy deposited product of the present invention, the deposit is made in double-layered structure. The pre-plated layer of Si should be thicker than 0.05 μm and the Al-Cr alloy layer should be thicker than 1 μm. With a thickness smaller than 0.05 μm, the pre-plated layer of Si is too thin to cover the substrate steel sheet completely, and hence it does not effectively suppress the formation of Fe-Al intermetallic compounds, nor does it improve the heat resistance satisfactorily. (See FIG. 7.) The upper Al-Cr alloy deposited layer is required to be thicker than 1 μm so that it provides the desired corrosion resistance in a corrosive environment at high temperatures. Incidentally, the Cr content in the Al-Cr alloy deposited layer should be 1 to 50 wt % in total so that the deposited layer exhibits sufficient corrosion resistance at high temperatures.

The above-mentioned double-layered structure of deposit can be obtained by forming an Si layer (thicker than 0.05 μm) on a degreased, pickled substrate steel sheet by vapor deposition at $10^{-3}$ Torr or below and subsequently forming an Al-Cr alloy layer (thicker than 1 μm) on the Si layer by vapor deposition at $10^{-3}$ Torr or below. (The vacuum in the vacuum chamber is not broken after the first vapor deposition.) If the pressure at the time of vapor deposition is higher than $10^{-3}$ Torr, the substrate steel sheet, Si, and Al-Cr alloy become oxidized, with the result that the deposited layer is poor in adhesion and hence easily peels off in the subsequent forming and other steps. If the first Si deposited layer is exposed to the atmosphere before the second vapor deposition of Al-Cr alloy, the Si deposited layer becomes oxidized, resulting in the poor adhesion of the Al-Cr alloy deposited layer, which leads to unsatisfactory formability.

The effect of Si on suppressing the formation of Fe-Al intermetallic compounds can also be produced by an Si alloy having a proper composition. A pre-plated layer of an Al-Si alloy containing more than 10% of Si prevents the formation of brittle Fe-Al intermetallic compounds at the interface between the deposited layer and the substrate steel sheet and also retains the good adhesion of the deposited layer to the substrate steel sheet even in an environment at high temperatures. The higher the Si content, the better the effect. However, the Si content in the Al-Si alloy should be lower than 90%; otherwise, the pre-plated layer (the first layer) of the Al-Si alloy reduces the adhesion of the corrosion-resistant Al-Cr alloy deposited layer (the second layer) to the substrate steel sheet, with the result that the second layer is liable to flaking and peeling at the time of bending and other forming. This is because silicon is slightly poor in adhesion to the second layer.

Silicon is not the only metal that can be used for the pre-plated layer of the double-layer structure mentioned above. Any element or alloy can be employed in place of silicon so long as it produces the effect of suppressing the formation of Fe-Al intermetallic compounds. Among such elements and alloys are Cu, Cr, and alloys thereof (e.g., Cr alloys with ferrous metals such as Ni, Co, and Fe). Al-Si alloys of certain composition can also be used. These elements and alloys produce their effects under different conditions (including compositions). This is explained in the following.

Cu, like Si, effectively suppresses the formation of Fe-Al intermetallic compounds. A pre-plated layer of pure copper, which should preferably be thicker than 0.05 μm, will achieve the object. A Cu alloy containing Al, Ni, or Sn also produces the same effect. For example, a Cu-Al alloy containing more than 70% of Cu produces the desired effect. The Cu-Al alloy is effective only when used as a pre-plated layer under the Al-Cr alloy deposited layer, because it is poor in corrosion resistance at high temperatures.

Cr effectively prevents the formation of Fe-Al intermetallic compounds, as will be expected from the foregoing explanation of the Al-Cr alloy deposited product in which the Cr content gradually increases with distance across the thickness of the deposited layer. Thus, it can be used for a pre-plated layer under the Al-Cr alloy deposited layer. A disadvantage of the Cr layer is that it is comparatively hard and liable to cracking at the time of forming. Cracking permits the mutual diffusion of Fe and Al between the substrate steel sheet and the Al-Cr alloy deposited layer. Therefore, a Cr alloy is preferable to pure Cr when it comes to a pre-plated layer of the Al-Cr alloy deposited product of the double-layer structure in the present invention. The desirable Cr alloy contains one or more than one ferrous metal such as Ni, Co, and Fe. The deposited layer of such a Cr alloy is more ductile than that of pure Cr; and therefore, it is less liable to cracking during forming. In addition, these alloying metals promote the passivation of Al and Cr and form a stable protective film. In other words, the Cr alloy forms a layer which does not crack at the time of forming and hence helps improve the heat resistance and corrosion resistance of the deposited layer. In addition, the Cr alloy layer and Al-Cr alloy layer form an alloy layer composed of Al and Cr as the result of diffusion caused by heating, and this alloy layer improves the heat resistance and corrosion resistance further.

In the case of the above-mentioned double-layer structure for the Al-Cr alloy deposited steel sheet of the present invention, the Cr alloy layer should preferably contain 1 to 50% of ferrous metals. With less than 1%, the alloy does not produce the effect of preventing the deposited layer from cracking at the time of forming. Conversely, with more than 50%, the alloy does not produce the effect of improving the heat resistance and corrosion resistance through the passivation of Cr. The Cr alloy layer should preferably be thicker than 0.1 μm. With a thickness smaller than 0.1 μm, the Cr alloy layer does not completely cover the substrate steel sheet and hence does not improve the heat resistance and corrosion resistance. The Cr alloy layer does not have the upper limit of thickness; but it should be thinner than 10 μm in consideration of its function as the pre-plated layer.

In the meantime, it is difficult to control the evaporation of pure Cr because pure Cr sublimes when heated in a vacuum. This disadvantage can be overcome by using a Cr alloy containing at least one ferrous metal. The Cr alloy can be evaporated from a molten Cr-alloy bath, and this makes it easy to control the amount of evaporation. The Cr alloy has another advantage that it can be continuously fed to the crucible in the form of wire or sheet. This permits the continuous operation for a long period of time.

Although the Al-Cr alloy deposited layer adheres to the substrate metal considerably well, it may partly peel off when subjected to intensive forming or used under severe conditions. The adhesion may be improved by the aid of double-layer structure formed in the following manner. At first, the substrate metal is provided with a pre-plating (strike plating) by vapor deposition, and then, the Al-Cr alloy deposited layer is formed on the pre-plated layer. The pre-plated layer should be made of pure aluminum and should be thicker than 0.01 $\mu$m for the improvement of adhesion. The pre-plating produces its effect regardless of the type of the substrate metal. The pure aluminum constituting the pre-plated layer reduces the thin oxide film layer on the surface of the substrate metal and activates the surface, thereby providing good adhesion between the aluminum plated layer and the substrate metal. The pre-plated layer of pure aluminum has good affinity for the Al-Cr alloy deposited layer placed thereon, and hence they adhere together very well. Thus firm bonding is established between the upper Al-Cr deposited layer and the substrate metal. The lower preplated layer of pure aluminum may be formed by vapor-depositing aluminum alone at a pressure lower than $10^{-2}$ Torr in the same manner as in the case of forming the Al-Cr alloy deposited layer as mentioned above.

The above-foregoing is concerned with the Al-Cr alloy deposited product of the present invention which has the double-layer structure formed by coating the substrate steel sheet with a pre-plating layer of Cr or Cr alloy and then forming the Al-Cr alloy deposited layer thereon. The product of such double-layer structure can have improved corrosion resistance if it is provided with a third (top) layer of aluminum or it has triple-layer structure. The third (top) layer of aluminum performs the sacrificial corrosion protective action on the Al-Cr alloy thereunder, because Al is potentially less noble than Cr and there is a great potential between them. The top layer of aluminum formed on the second layer of Al-Cr alloy is subject to corrosion which takes place by galvanic action in pinholes that occur therein. Until the top aluminum layer is completely dissolved, the corrosion of the Al-Cr alloy deposited layer is suppressed. In this manner, the product of the present invention is given the increased durability. The triple-layer structure provides the substrate steel sheet with a corrosion-resistant protective film with good adhesion, because the top aluminum layer firmly bonds to the second Al-Cr alloy layer which also firmly bonds to the pre-plated layer of Cr or Cr alloy.

In the case of triple-layer structure mentioned above, the pre-plated layer and the second layer should have the layer thickness as specified above. With a total thickness smaller than 1 $\mu$m, the protective layers do not exhibit sufficient corrosion resistance and heat resistance, although they have satisfactory formability. With a total thickness in excess of 15 $\mu$m, the protective layers take such a long time for vapor deposition that the substrate steel sheet gets hot and loses it mechanical properties. In addition, an excessively large thickness is economically undesirable. Therefore, the total thickness of the three layers should be 1 to 15 $\mu$m, preferably 3 to 10 $\mu$m.

Figure 8:
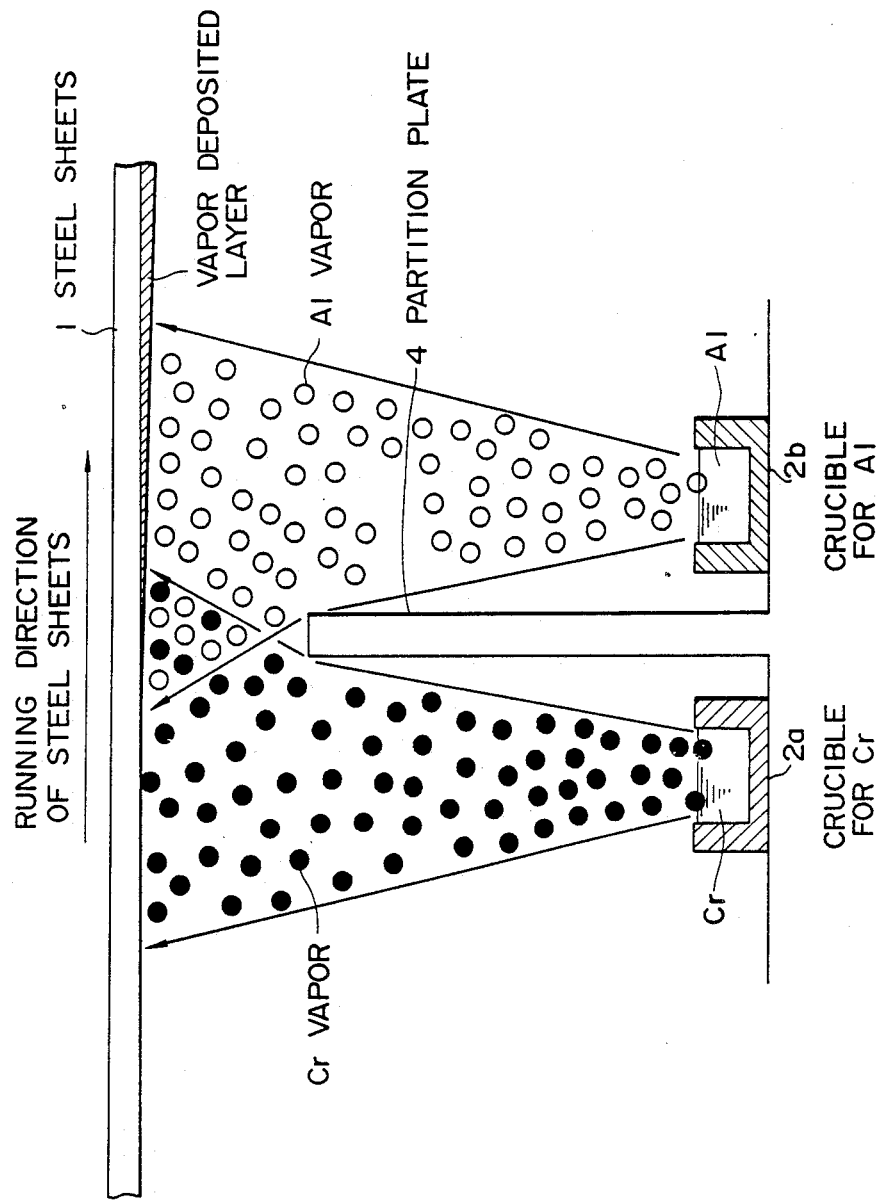
FIG. 8 is a schematic representation showing the process for producing a vapor-deposited steel sheet of triple-layer type according to the present invention.

The product of the present invention which has the triple-layer structure is produced in the following manner which is given as an example. At first, a steel sheet 1 which has undergone pretreatment for surface activation is placed in the vacuum chamber of a vapor deposition apparatus. The crucibles 2a, 2b containing Cr and Al vapor sources, respectively, are arranged in the vacuum chamber as shown in FIG. 8. The two crucibles are separated from each other by a partition plate 4. The Al and Cr in the crucibles are irradiated with electron beams for evaporation, and at the same time, the preheated steel sheet 1 is run above the crucibles in the direction of arrow. Vapor deposition takes place sequentially. The Cr vapor deposits first on the steel sheet, forming the first layer. Then, the mixture of the Cr vapor and Al vapor deposits on the steel sheet, forming the second layer of Al-Cr alloy. Finally, the vapor of pure aluminum deposits on the steel sheet, forming the third layer. The partition plate 4 prevents the Cr vapor and Al vapor from going beyond the mixture region. Thus it is possible to form the lower layer of pure Cr and the top layer of pure Al separately. According to the above-mentioned process, it is possible to adjust the thicknesses of the three layers by controlling the power of electron beams applied to the crucibles 2a, 2b, the height of the partition plate 4, and the line speed of the steel sheet 1.

The present invention embraces the Al-Cr alloy deposited product, with the Al-Cr alloy incorporated with a third component such as Si. The product with a deposited layer of Al-Cr-Si ternary alloy is superior in both corrosion resistance and heat resistance. The outstanding heat resistance is attributable to Si which prevents the formation of Fe-Al intermetallic compounds. However, when it comes to corrosion resistance, Si functions rather negatively. (This is the reason why the conventional Al-Si ally product is not durable.) On the other hand, Cr greatly improves the corrosion resistance of Al alloys as mentioned above. Therefore, the Al-Cr-Si ternary alloy exhibits outstanding corrosion resistance owing to Cr which overcomes the disadvantage (low corrosion resistance) of the Al-Si alloy. Cr also prevents the formation of Fe-Al intermetallic compounds in concert with Si. This leads to the outstanding heat resistance.

In the case of the product having the Al-Cr-Si ternary alloy deposited layer, the Cr content should be 1 to 30%. With less than 1%, Cr does not improve the corrosion resistance; and with more than 30%, Cr does not increase the corrosion resistance any longer. With more than 50%, Cr does not provide satisfactory corrosion resistance. Presumably, this is because the higher Cr content relatively reduces the Al content and hence Al does not produce its effect of corrosion resistance. On the other hand, the Si content should be 1 to 20%. With less than 1%, Si does not improve the heat resistance as shown in Examples. With more than 20%, Si does not increase the heat resistance any longer but adversely affects the corrosion resistance.

The above-mentioned ternary alloy may contain Ti in place of Si. The product having the Al-Cr-Ti ternary alloy deposited layer is superior to that having the Al-Cr alloy deposited layer in corrosion resistance at high temperatures. Ti and Cr synergistically improve the corrosion resistance of the Al-Cr alloy which has the highest corrosion resistance among binary Al alloys. Thus the Al-Cr-Ti ternary alloy provides the higher corrosion resistance than the binary Al alloys. The total content of Cr and Ti in the ternary alloy should preferably be 2 to 50%. With less than 2%, Cr and Ti do not produce their synergistic effect on the improvement of corrosion resistance. With more than 50%, Cr and Ti make the potential of the alloy deposited layer noble, lowering the sacrificial corrosion protective action on the substrate steel sheet. For Cr and Ti to produce their synergistic effect, it is necessary to add Cr and Ti in an amount of at least 1%. Each content of Cr and Ti should preferably be less than 49% so that the total content of Cr and Ti does not exceed the upper limit.

The Al-Cr-Ti alloy deposited layer is not specifically limited in thickness. However, with a thickness smaller than 0.1 μm, the alloy layer does not completely cover the substrate metal, nor does it exhibit its corrosion protective function. Therefore, a thickness greater than 0.1 μm is desirable.

The Al-Cr-Ti ternary alloy deposited layer is formed by the vapor deposition process. However, these three components cannot be evaporated all at once from a single crucible because they are different from one another in equilibrium vapor pressure. In other words, their equilibrium vapor pressure at their evaporation temperature decreases in the order of Al, Cr, and Ti. The desired amount of evaporation can be obtained by properly heating the crucibles each containing Ti and Al-Cr alloy, or Al and Cr-Ti alloy, or Al, Cr, and Ti. Thus it is possible to obtain the Al-Cr-Ti alloy deposit of desired composition.

The present invention also embraces the Al-Cr alloy deposited product, with the Al-Cr alloy incorporated with one or more elements selected from the group consisting of Ni, Fe, and Co. The product with the deposited layer of a ternary or multi-component Al alloy is superior in not only corrosion resistance but also heat resistance and oxidation resistance. It is considered that ferrous elements promote the formation of passivation film of Al and Cr and also stabilize thus formed passivation film. It is also considered that the alloying with Al and Cr improves heat resistance and oxidation resistance. Cr added to the ternary alloy or multi-component alloy produces the same effect as mentioned above.

Figure 9:
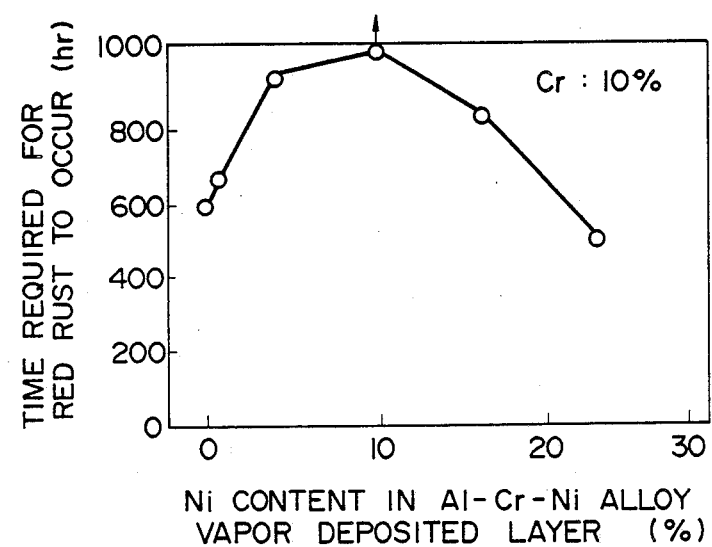
FIG. 9 is a graph showing the relation between the Ni content in an Al-Cr-Ni alloy deposit layer and the time required for red rust to occur in the case of Al-Cr-Ni alloy-deposited steel sheets.

The above-mentioned ferrous elements such as Ni, Fe, and Co produce the remarkable effect of improving corrosion resistance when added in a total amount of 1% or above. However, with a total amount in excess of 20%, they prevent the Al alloy deposited layer from performing the sacrificial protective action on the substrate steel sheet. The effect of Ni on corrosion resistance was examined by changing the amount of Ni in the Al-Cr-Ni ternary alloy containing 10% Cr which was made into the deposited layer on a substrate steel sheet. The results are shown in FIG. 9 by plotting the Ni content against the time required for red rust to occur. It is noted from FIG. 9 that the effect of Ni is most remarkable when the Ni content is 10%, and the effect of Ni decreases when the Ni content exceeds 20%. This is the case with Fe and Co. And this tendency is also observed in the case where more than one kind of ferrous elements are added.

EXAMPLES

In the following Examples 1 to 6, steel sheets, Al-alloy sheets, and Cu-alloy sheets, each measuring 100 mm wide, 150 mm long, and 0.6 mm thick, were used as substrate metals after degreasing in an alkaline solution, rinsing, and drying. The substrate metal was mounted in the vacuum chamber of a vapor deposition apparatus provided with two crucibles. One crucible was charged with Al, and the other crucible, Cr. The vacuum chamber was evacuated to $10^{-3}$ Torr Al and Cr were evaporated separately by heating with electron beams, so that an Al-Cr alloy layer of desired composition was deposited on the substrate metal.

Example 1

Steel sheets and Cu-alloy sheets were provided with a 5-μm thick Al-Cr alloy deposited layer containing a varied amount of Cr. The metal sheets with a deposited layer underwent salt spray test. The improvement of corrosion resistance achieved by the addition of Cr is graphically shown in FIG. 1 by plotting the Cr content against the time required for white rust to occur which is expressed in terms of index, with 1 representing the time required for white rust to occur in the case where the deposited layer is made from pure Al (containing no Cr). It is noted from FIG. 1 that corrosion resistance increases in proportion to the Cr content. Cr produces its remarkable effect when its content is 1% or above.

Example 2

Figure 2:
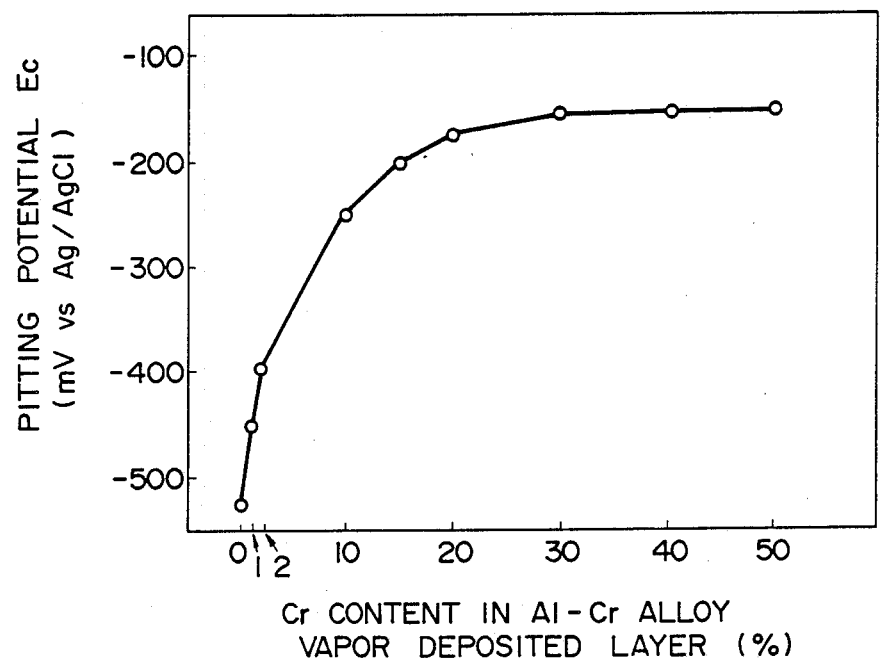
FIG. 2 is a graph showing the relation between the Cr content in the Al-Cr alloy deposit layer and the pitting potential (Ec).

Al alloy sheets (5052) were provided with a 4-μm thick Al-Cr alloy deposited layer containing a varied amount of Cr in the same manner as in Example 1. The Al alloy sheets with the deposited layer were immersed in a 2% citric acid containing 100 ppm of chloride ions (of NaCl) to measure the pitting potential (Ec) according to the potentiostatic anodic polarization method. The improvement of pitting resistance achieved by the addition of Cr is graphically shown in FIG. 2 by plotting the Cr content against the pitting potential (Ec). The pitting potential of the Al-Cr alloy deposited layer is nobler than that of the pure Al deposited layer. Cr produces the effect of improving the pitting resistance when its content is 1% or above, and the Ec levels off when the Cr content reaches 50%.

Example 3

Figure 3:
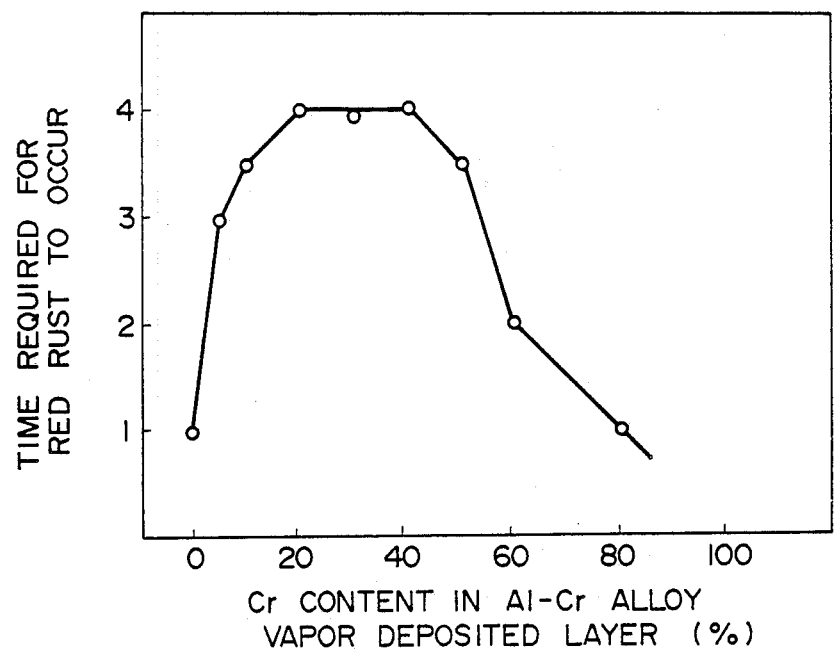
FIG. 3 is a graph showing the relation between the Cr content in the Al-Cr alloy deposit layer and the time required for red rust to occur.

Steel sheets were provided with a 5-μm thick Al-Cr alloy deposited layer containing a varied amount of Cr in the same manner as in Example 1. The steel sheets with a deposited layer underwent salt spray test. The improvement of corrosion resistance achieved by the addition of Cr is graphically shown in FIG. 3 by plotting the Cr content against the time required for red rust to occur which is expressed in terms of index, with 1 representing the time required for red rust to occur in the case where the deposited layer is made of pure Al. It is noted from FIG. 3 that corrosion resistance increases in proportion to the Cr content. However, the effect of Cr decreases when the Cr content exceeds 50%. It is concluded from the results in Examples 1 to 3 that the content of Cr in the Al-Cr alloy should be 1 to 50%.

Example 4

Figure 4:
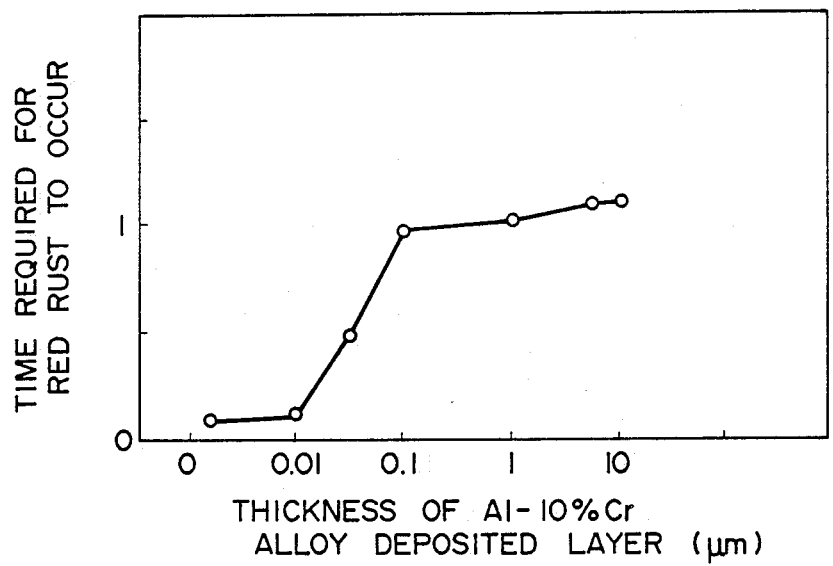
FIG. 4 is a graph showing the relation between the thickness of Al-10% Cr alloy deposit layer and the time required for red rust to occur.

Steel sheets were provided with an Al-10% Cr alloy deposited layer of varied thickness. The steel sheets with a deposited layer underwent salt spray test. The improvement of corrosion resistance which depends on the deposited layer thickness is graphically shown in FIG. 4 by plotting the thickness against the time required for red rust to occur which is expressed in terms of index, with 1 representing the time required for red rust to occur in the case where the thickness is 0.1 μm. It is noted from FIG. 4 that corrosion resistance is improved when the thickness is greater than 0.01 μm and the maximum corrosion resistance is obtained when the thickness is greater than 0.1 μm.

Example 5

Steel sheets were provided with a 5-μm thick Al-15% Cr alloy deposited layer at varied pressure in the vacuum chamber. The steel sheets with a deposited layer underwent adhesion test. The adhesion test was run by peeling the deposited layer with an adhesive tape. In the case of 180° bending test, an adhesive tape was stuck to the apex of the bend. The results are shown in Table 1.

TABLE 1

| Run No. | Pressure (Torr) | Peeling (as-vapor deposited) | Peeling (after 180° bending) |
| --- | --- | --- | --- |
| 1 | $5 \times 10^{-2}$ | Peeled | Peeled |
| 2 | $10^{-2}$ | Not peeled | Slightly peeled |
| 3 | $5 \times 10^{-3}$ | Not peeled | Not peeled |
| 4 | $10^{-3}$ | Not peeled | Not peeled |
| 5 | $10^{-4}$ | Not peeled | Not peeled |

It is noted from Table 1 that the vapor deposition of the Al-Cr alloy should be performed at a pressure lower than $10^{-2}$ Torr, preferably lower than $10^{-3}$ Torr.

Example 6

Steel sheets were provided with a pre-plating of pure aluminum having a varied thickness deposited under a pressure of $10^{-3}$ Torr. The pre-plated steel sheets were provided with a 5-μm thick Al-5% Cr alloy deposited layer under a pressure of $10^{-3}$ Torr. The steel sheets with a deposited layer underwent adhesion test in the same manner as in Example 5. The results are shown in Table 2.

TABLE 2

| Run No. | Thickness of pre-plating (μm) | Peeling (as-vapor deposited) | Peeling (after 180° bending) |
| --- | --- | --- | --- |
| 1 | none | Not peeled | Peeled |
| 2 | 0.01 | Not peeled | Slightly peeled |
| 3 | 0.05 | Not peeled | Not peeled |
| 4 | 0.1 | Not peeled | Not peeled |
| 5 | 1.0 | Not peeled | Not peeled |

It is noted from Table 2 that the adhesion of the Al-Cr alloy deposited layer is improved by providing a pre-plating of pure aluminum thicker than 0.01 μm.

The fundamental effect of the present invention is proven by the above-mentioned Examples 1 to 6. Supplemental examples are given in the following.

Example 7

Steel sheets measuring 150×150×0.7 mm were used as substrate metals after alkali electrolytic degreasing and rinsing. The substrate steel sheet was mounted in the vacuum chamber of a vapor deposition apparatus provided with two crucibles. One crucible was charged with Al base metal, and the other crucible, Cr base metal. The substrate metal and the crucibles were kept apart at a certain distance. The vacuum chamber was evacuated to a prescribed pressure, and the substrate steel sheet was preheated to a prescribed temperatures. The Al base metal and Cr base metal were evaporated separately by heating with electron beams, so that an Al-Cr alloy layer of desired composition was deposited on the substrate steel sheet. The thickness and composition of the Al-Cr alloy deposited layer were properly adjusted by controlling the power of the electron beam irradiating the Al base metal and Cr base metal.

The Al-Cr alloy layer deposited steel sheets thus obtained underwent the following tests. The results are shown in Table 3. (Run No. 11 in Table 3 represents a hot dip aluminized (9% Si) steel sheet.)

(1) Corrosion resistance test

The specimen with its center jutted out 9 mm using an Ericksen tester underwent salt spray test (5% NaCl solution) at 35° C. Corrosion resistance was evaluated by measuring the time required for red rust to occur on the specimen.

(2) Adhesion test

Adhesion was evaluated by peeling the deposited layer with an adhesive tape stuck to the apex of a 180° bent specimen measuring 20×50 mm. (Good: no peeling of deposited layer, Fair: little peeling of deposited layer, Poor: partial peeling of deposited layer)

(3) X-ray diffraction

Cu-Kα rays
Ni filter
Acceleration voltage: 50 kV
Full scale of chart: 4000 cps

TABLE 3

| Run No. | Composition of deposited layer | Thickness of deposited layer (μm) | Phase structure* | Salt spray test (h)** | Adhesion of deposited layer | (Remarks) Plating method |
| --- | --- | --- | --- | --- | --- | --- |
| (1) | Pure Al | 6.4 | Al | 182 | Good | Vapor deposition |
| (2) | Al-0.6% Cr | 6.0 | Al, θ(Al$_{13}$Cr$_2$) | 206 | Good | Vapor deposition |
| 3 | Al-1.2% Cr | 6.5 | Al, θ, Cr (little) | 380 | Good | Vapor deposition |
| 4 | Al-7.2% Cr | 5.8 | Al, θ, Cr | 484 | Good | Vapor deposition |
| 5 | Al-16.7% Cr | 6.8 | Al, θ, Cr | 820 | Good | Vapor deposition |
| 6 | Al-23.2% Cr | 6.4 | Al, θ, Cr | 802 | Good | Vapor deposition |
| 7 | Al-29.0% Cr | 6.8 | Al, θ, Cr | 720 | Good | Vapor deposition |
| (8) | Al-27.2% Cr | 6.9 | Al, θ, Cr, η | 480 | Fair | Vapor deposition |
| (9) | Al-42.6% Cr | 7.0 | Al, θ, Cr, η | 520 | Poor | Vapor deposition |
| (10) | Al-55.1% Cr | 6.7 | Al, θ (little), Cr, η | 420 | Poor | Vapor deposition |
| (11) | Hot dip aluminized (9% Si) | 7.4 | Al, Al—Fe—Si, Si | 221 | Fair | Hot dipping |

*determined according to X-ray diffraction patterns.
**in terms of the time required for red rust to occur.
Parenthesized run numbers represent Comparative Examples.

It is noted from Table 3 that the Al-Cr alloy deposited steel sheets obtained in run Nos. 3 to 7 are superior in corrosion resistance and adhesion because the deposited layer contains 1 to 30% of Cr and consists substantially of Al, Cr, and θ phase (Al$_{13}$Cr$_2$) according to X-ray diffraction patterns. The Al-Cr alloy deposited steel sheets obtained in run Nos. 1 and 2 are superior in adhesion but poor in corrosion resistance (like the one in run No. 11. The Al-Cr alloy deposited steel sheet obtained in run No. 8 is found to contain the η phase (Al$_5$Cr or Al$_{11}$Cr$_2$) according to X-ray diffraction patterns, although the Al-Cr deposited layer contains 1 to 30% of Cr. The η phase is formed depending on the preheating temperature of the substrate; and it provides good corrosion resistance but impairs adhesion. The Al-Cr alloy deposited steel sheets obtained in run Nos. 9 and 10 are superior in corrosion resistance but poor in adhesion because the deposited layer contains more than 30% of Cr. In addition, it is found to contain the η phase according to X-ray diffraction patterns.

Example 8

The specimens obtained in Example 7 underwent corrosion simulation test for vehicle exhaust mufflers in the following manner. The results are shown in Table 4.

Test method

The lower half of each specimen measuring 70×150 mm is immersed in the muffler artificial synthetic solution having a composition given below. The ratio of red rust occurrence is examined after 40 cycles of immersion, each cycle consisting of immersion at 50° C. for 7 hours and immersion at room temperature for 17 hours.

| Composition of the solution: | |
|---|---|
| NH$_4$NO$_3$ | 1.30 g/L |
| (NH$_4$)$_2$SO$_4$ | 0.69 g/L |
| NH$_4$Cl | 0.04 g/L |
| HCHO | 0.4 g/L |

TABLE 4

| Run No. | Composition of plated layer | Thickness of plated layer (μm) | Ratio in immersed part* | Ratio in exposed part* | Phase structure** | Remarks Plating method |
|---|---|---|---|---|---|---|
| (1) | Pure Al | 6.4 | 10 | spot rust | Al | Vapor deposition |
| (2) | Al-0.6% Cr | 6.0 | 15 | spot rust | Al, θ | Vapor deposition |
| 4 | Al-7.2% Cr | 5.8 | 2~3 | spot rust | Al, θ, Cr | Vapor deposition |
| 5 | Al-16.7% Cr | 6.8 | spot rust | 0 | Al, θ, Cr | Vapor deposition |
| 7 | Al-29.0% Cr | 6.8 | 2 | 0 | Al, θ, Cr | Vapor deposition |
| (10) | Al-55.1% Cr | 6.7 | 15 | 2~3 | Al, θ, Cr, η | Vapor deposition |
| (11) | Hot dip aluminized (9% Si) | 7.4 | 60 | 10 | Al, Al—Fe—Si, Si | Hot dipping |

*The ratio of red rust occurrence expressed in terms of area %.
**Determined according to X-ray diffraction patterns.
Parenthesized run numbers represent Comparative Examples.

It is noted from Table 4 that the specimens in run Nos. 4, 5, and 7, which pertain to the present invention, have a lower ratio of red rust occurrence and hence have better corrosion resistance than the specimens in run Nos. 1, 2, 10 and 11.

Example 9

Cold rolled steel sheets and Al alloy sheets, each measuring 100×150×0.6 mm, were used as substrate metal sheets. The substrate metal sheet was mounted in the vacuum chamber of a vapor deposition apparatus provided with two crucibles. One crucible was charged with Al base metal, and the other crucible, Cr base metal. The substrate metal sheet and the crucibles were kept apart at a certain distance. The vacuum chamber was evacuated to $10^{-4}$ Torr, and the Al base metal and Cr base metal were evaporated separately by heating with electron beams, so that an Al-Cr alloy layer was deposited on the substrate metal sheet. The power of the electron beams was adjusted so that the ratio of Al and Cr which deposit on the substrate metal sheet gradually changes. Thus the Cr content in the deposited layer increases with distance across the thickness from the bottom to the surface. The thickness of the deposited layer ranges from 0.1 to 15 μm. The thus obtained Al-Cr alloy deposited steel sheets and Al-alloy sheets have the thickness and composition (Cr content) of the deposited layer as shown in Tables 5 and 6.

The specimens based on the steel substrate underwent corrosion test by immersion in dilute (0.05 N) H$_2$SO$_4$ solution, and the time required for red rust to occur on the substrate steel sheet was measured. The specimens based on the Al-alloy substrate underwent corrosion test by immersion in 0.2% citric acid solution containing 100 ppm of NaCl at room temperature, and corrosion resistance was rated in terms of pitting potential obtained from a potentiostatic anodic polarization curve. The results are shown in Tables 5 and 6. For the purpose of comparison, the same test as above was performed on hot dip pure aluminized steel sheets and hot dip aluminized (9% Si) steel sheets. The results are also shown in Tables 5 and 6.

TABLE 5

| Run No. | Plating | Thickness of plating (μm) | Cr content at bottom (%) | Cr content at surface (%) | Time for red rust to occur (h) |
|---|---|---|---|---|---|
| (1) | Hot dip aluminized | 8.4 | — | — | 120 |
| (2) | Hot dip aluminized (9% Si) | 9.0 | 9 | 9 | 160 |
| 3 | Al—Cr vapor deposition | 8.9 | 2 | 40 | 700 |
| 4 | Al—Cr vapor deposition | 8.7 | 10 | 50 | 750 |
| 5 | Al—Cr vapor deposition | 8.9 | 10 | 70 | 720 |
| 6 | Al—Cr vapor deposition | 8.7 | 8 | 75 | 740 |
| 7 | Al—Cr vapor deposition | 8.8 | 30 | 30 | 360 |

Parenthesized run numbers represent Comparative Examples.

TABLE 6

| Run No. | Plating | Thickness of plating (μm) | Cr content at bottom (%) | Cr content at surface (%) | Pitting potential (V vs Ag/AgCl) |
|---|---|---|---|---|---|
| (8) | Hot dip aluminized (9% Si) | 9.1 | 9.1 | 9.1 | −0.55 |
| 9 | Al—Cr vapor deposition | 8.9 | 2 | 40 | −0.25 |
| 10 | Al—Cr vapor deposition | 8.8 | 10 | 50 | −0.23 |
| 11 | Al—Cr vapor deposition | 8.9 | 10 | 70 | −0.25 |
| 12 | Al—Cr vapor deposition | 8.8 | 5 | 75 | −0.21 |

Parenthesized run numbers represent Comparative Examples.

It is noted from Table 5 that the conventional materials with Al plating or Al-Si plating formed by hot dipping (in run Nos. 1 and 2) have insufficient corrosion resistance (as indicated by the fact that red rust occurred within about 160 hours at the longest), whereas the Al-Cr alloy vapor deposited steel sheet pertaining to the present invention exhibited outstanding corrosion resistance (as indicated by the fact that it took more than 700 hours for red rust to occur). However, this is not the case in run No. 7 wherein the Cr content is not gradated across the thickness of the plating. Presumably, this is because the adhesion of the plating to the substrate steel sheet is not sufficient.

It is noted from Table 6 that the Al-Cr alloy vapor deposited steel sheet (run Nos. 9 to 12) pertaining to the present invention is by far superior in corrosion resistance (in terms of pitting potential) to the conventional materials with Al-Si plating formed by hot dipping (in run No. 8).

The same cold rolled steel sheets as mentioned above were provided with an Al-Cr alloy deposited layer having a gradated Cr content by ion plating (IP) or sputtering (SP) in place of physical vapor deposition. The specimens were examined for the time required for red rust to occur. The results are shown in Table 7. It is noted from Table 7 that both IP and SP provide good corrosion resistance as vapor deposition does.

TABLE 7

| Run No. | Plating | Thickness of plating (μm) | Cr content at bottom (%) | Cr content at surface (%) | Time for red rust to occur (h) |
|---|---|---|---|---|---|
| (8) | Hot dip aluminized (9% Si) | 9.1 | — | — | 160 |
| 9 | Al—Cr vapor deposition | 8.9 | 2 | 40 | 700 |
| 10 | Al—Cr ion plating | 8.8 | 3 | 41 | 710 |
| 14 | Al—Cr sputtering | 8.1 | 15 | 40 | 700 |

Parenthesized run numbers represent Comparative Examples.

Example 10

Cold rolled steel sheets measuring 70×150×0.6 mm were used as substrate metals after alkali electrolytic degreasing, rinsing, and drying. The substrate steel sheet was subjected to vapor deposition with an Al-Cr alloy, Al-Ti alloy, or Al-Cr-Ti alloy in a vacuum. The specimens underwent salt spray test. The corrosion resistance of the deposited layer was evaluated by measuring the time required for red rust to cover 5% of the surface area. For the purpose of comparison, the same test as mentioned above was performed on a steel sheet with an Al alloy deposited layer whose composition does not meet the requirements of the present invention, a steel sheet with a pure aluminum vapor deposited layer, a steel sheet with a hot dip Al-9% Si alloy plating, and a steel sheet with two vapor deposited layers (Al upper layer and Cr lower layer). The results are shown in Table 8. The adhesion of the deposited layer was evaluated by the 180° bending test.

TABLE 8

| Run No. | Plated layer | Average content of alloying metals (%) | Content of alloying metals at surface (%) | Content of alloying metals at bottom (%) | Thickness of plated layer (μm) | Adhesion of plated layer | Salt spray test (h)* |
|---|---|---|---|---|---|---|---|
| 1 | Al—Cr | 16.0 | 0.1 | 60 | 7.0 | Excellent | >1000 |
| 2 | Al—Cr | 17.4 | 0.1 | 72 | 6.8 | Excellent | >1000 |
| 3 | Al—Cr | 23.2 | 0.5 | 88 | 7.4 | Good | >1000 |
| 4 | Al—Cr | 43.2 | 1 | 90 | 7.2 | Good | >1000 |
| 5 | Al—Ti | 20.4 | 0.2 | 78 | 7.0 | Good | 940 |
| 6 | Al—Ti | 36.6 | 0.3 | 87 | 7.0 | Good | >1000 |
| 7 | Al—Ti | 46.5 | 0.5 | 90 | 6.4 | Good | >1000 |
| 8 | Al—Cr—Ti | 42.2 (Cr + Ti) | Cr 0.4 Ti 0.1 | 43 40 | 6.9 | Good | >1000 |
| (9) | Al—Cr | 26 | 0.03 | 100 | 6.5 | Fair | 860 |
| (10) | Al—Ti | 43 | 0.1 | 97 | 7.3 | Poor | 720 |
| (11) | Al | — | (note 1) | (note 1) | 7.0 | Excellent | 230 |
| (12) | Al(Si 9%) | — | (note 2) | (note 2) | 7.4 | Good | 260 |
| (13) | Al/Cr | — | (note 3) | (note 3) | 5.5 | Fair | 200 |

Parenthesized run numbers represent Comparative Examples.
*in terms of the time required for red rust to occur.
Note 1: Pure Al vapor deposition.
Note 2: Hot dip aluminized (9% Si), with chromate treatment.
Note 3: Al upper layer 5 μm thick, Cr lower layer 0.5 μm thick.

It is noted from Table 8 that the specimens in run Nos. 1 to 8 which meet the requirements of the present invention have outstanding corrosion resistance and deposited layer adhesion. By contrast, the specimens in run Nos. 9 and 10 are poor in adhesion because the deposited layer contains more than 90% of Cr or Ti as the alloying metal at the bottom of the deposited layer. The specimens in run Nos. 11 and 12 are satisfactory in adhesion but poor in corrosion resistance because the substrate steel sheet is provided with a plating layer of pure aluminum or Al-9% Si alloy by hot dipping. Especially, the specimen in run No. 12 is poor in corrosion resistance although the Al plating underwent chromate treatment to form a protective thin film with high corrosion resistance. The specimen in run No. 13 is poor in corrosion resistance despite its plating of double-layer structure. (The substrate steel sheet is provided with a lower layer of Cr and an upper layer of pure Al. Cr is an alloying metal to improve the corrosion resistance of Al.) This is because the potential of Cr is much nobler than that of Fe and Al and this accelerates the corrosion of Al by pinholes, leading to the corrosion of the steel sheet. Therefore, the double-layer plating permits red rust to occur earlier than the plating of pure Al, and hence it does not exhibit the function of sacrificial corrosion protection.

Example 11

Cold rolled steel sheets which had been degreased and rinsed in the same manner as in Example 10 were provided with a vapor deposited layer of prescribed structure. The specimens were tested for heat resistance in the following manner.

Figure 10:
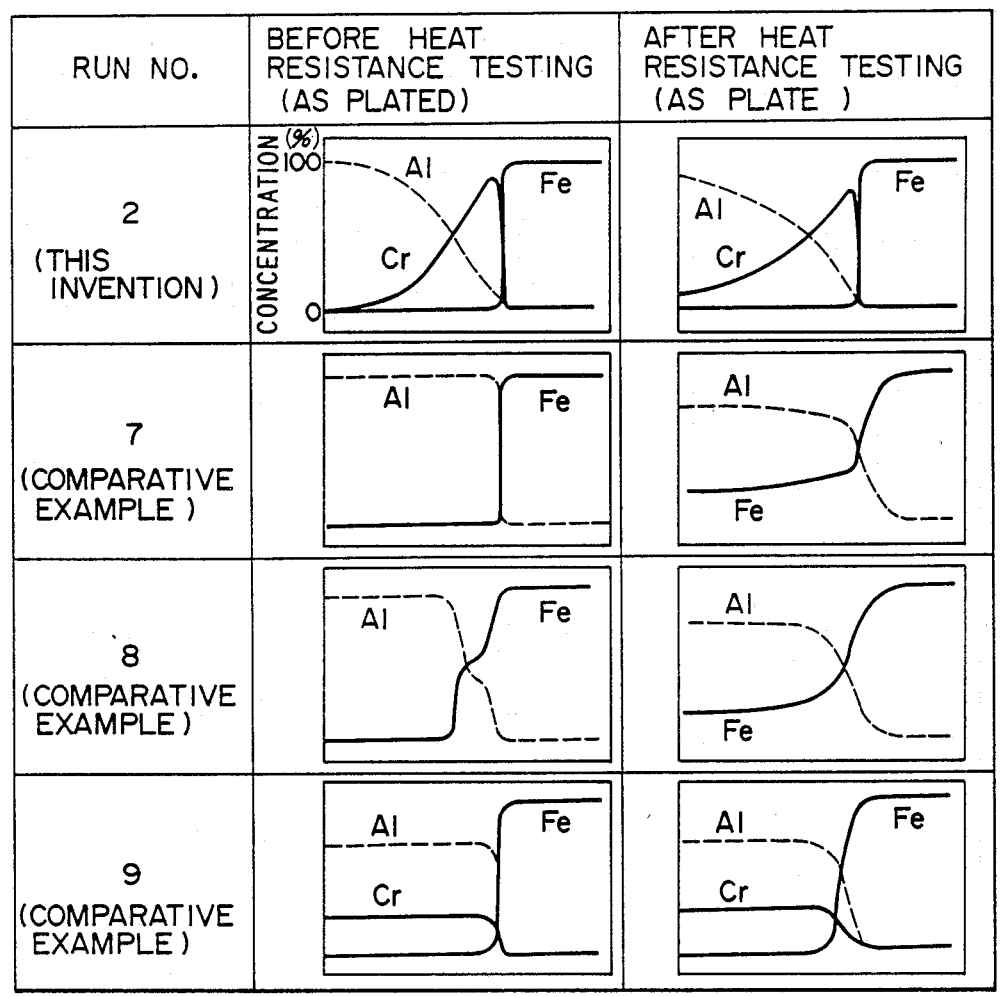
FIG. 10 shows the cross-section of the deposit layer on various deposited steel sheets.

Method of heat resistance test:

The specimen undergoes three cycles of heat treatment, each cycle consisting of heating at 450° C. for 5 hours in the atmosphere and air cooling for 19 hours. The cross section of the specimen is examined under a microscope to see the formation of Fe-Al intermetallic compounds at the interface between the substrate steel sheet and the plating layer before and after the heat treatment. The results are shown in Table 9. The composition which changes with distance across the thickness of the plating layer in each specimen is shown in FIG. 10. For comparison, the specimens in runs Nos. 7 to 9 were prepared by providing the substrate steel sheet with a plating of pure Al by vapor deposition, an Al plating by dipping, and an plating of Al-25% Cr (with a constant Cr content), respectively. Their test results are also shown in Table 9 and FIG. 10.

It is noted from Table 9 and FIG. 10 that the specimens in run Nos. 1 to 6 which meet the requirements of the present invention do not permit the layer of Fe-Al intermetallic compounds to form even after the severe heat resistance test. The specimen for comparison in run No. 7 which is provided with a plating of pure Al by vapor deposition does not have any Fe-Al intermetallic compounds (in its as-plated state) before the heat resistance test. By contrast, the specimen for comparison in run No. 8 which is provided with an Al plating by hot dipping has a layer of intermetallic compounds (1.9 μm thick) already before the heat resistance test. Despite this difference, the specimens in run Nos. 7 and 8 are the same in that the Al plating layer disappeared due to diffusion into the substrate steel sheet, allowing Fe to be exposed, after the heat resistance test. The specimen for comparison in run No. 9 which is provided with an Al-25% Cr alloy deposited layer, with the Cr content not gradated, does not have any Fe-Al intermetallic compounds at the interface before the heat resistance test, but permits a small amount of intermetallic compounds to be formed at the interface after the heat resistance test.

Example 12

Cold rolled steel sheets measuring 100×100×0.8 mm were used as substrate metals after degreasing and rinsing. The substrate steel sheet was subjected to first vapor deposition with Si in a vacuum of $10^{-3}$ Torr or below under proper conditions which give a desired layer thickness. The substrate steel sheet was further subjected to second vapor deposition with Al or an Al alloy under proper conditions which give a desired layer thickness. Thus there were obtained steel sheets with two deposited layers as shown in Table 10. The specimens were tested for adhesion, heat resistance, and corrosion resistance. The test methods are given below. The results are shown in Table 10. The results are also compared with those of the conventional steel sheet with an Al plating formed by hot dipping.

Adhesion of plating:

Judged by observing whether or not the plating layer peels off when the specimen is bent 180° before and after heat treatment at 450° C. for 5 hours.

TABLE 9

| Run No. | Plated layer | Alloying metals | Average content of alloying metals (%) | Content of alloying metals at surface (%) | Content of alloying metals at bottom (%) | Thickness of plating (μm) | Layer of Fe—Al intermetallic compound (μm)* | Effect of preventing Fe—Al intermetallic compound** |
|---|---|---|---|---|---|---|---|---|
| 1 | Al—Cr | Cr | 16.0 | 0.1 | 60 | 7.0 | None | Good |
| 2 | Al—Cr | Cr | 23.2 | 0.5 | 88 | 7.4 | None | Excellent |
| 3 | Al—Cr | Cr | 43.2 | 1 | 90 | 7.2 | None | Excellent |
| 4 | Al—Ti | Ti | 20.4 | 0.2 | 78 | 7.0 | None | Good |
| 5 | Al—Ti | Ti | 46.5 | 0.5 | 90 | 6.4 | None | Excellent |
| 6 | Al—Cr—Ti | Cr & Ti | 42.2 | Cr 40.4 Ti 0.1 | 43 40 | 6.9 | None | Excellent |
| (7) | Al | — | — | (note 1) | (note 1) | 7.0 | None | Poor |
| (8) | Al | — | — | (note 2) | (note 2) | 7.4 | 1.9 | Poor |
| (9) | Al—Cr | Cr | 25.0 | 25.0 | 25.0 | 6.9 | None | Fair |

Parenthesized run numbers represent Comparative Examples.
*Observed before heat treatment.
**Observed after heat treatment.
Note 1: Pure Al vapor deposition.
Note 2: Hot dip aluminized (9% Si).

Corrosion resistance:

Judged according to the ratio of the occurrence of red rust which is noticed when the specimen is dipped in 1% ammonium chloride solution at 90° C. for 2 days after heat treatment at 450° C. for 5 hours.

Heat resistance:

Judged by measuring the thickness of the layer of Al-Fe inermetallic compounds under a microscope before and after heat treatment at 450° C. for 5 hours.

TABLE 10

| Run No. | Plating structure | Plating thickness (μm) | Plating adhesion (as-plated) | Plating adhesion (after heating) | Alloy layer thickness (g/m$^2$) (as plated) | Alloy layer thickness (g/m$^2$) (after heating) | Ratio of red rust occurrence after corrosion test |
|---|---|---|---|---|---|---|---|
| 1 | Al/Si dual | 5/0.1 | No peel | No peel | 0 | 1.2 | 5% |
| 2 | Al/Si dual | 1/1.5 | No peel | No peel | 0 | 0.4 | 10% |
| 3 | Al/Si dual | 5/0.05 | No peel | No peel | 0 | 2.8 | 3% |
| 4 | Al/Si dual | 2/0.1 | No peel | No peel | 0 | 1.3 | 6% |
| 5 | Al-12% Cr/Si | 3/0.1 | No peel | No peel | 0 | 0.7 | 0% |
| 6 | Al-17% Mg/Si | 3/0.3 | No peel | No peel | 0 | 1.0 | 2% |
| 7 | Al-6% Ti/Si | 2/0.1 | No peel | No peel | 0 | 2.0 | 0% |
| 8 | Al-9% Sn/Si | 4/0.3 | No peel | No peel | 0 | 1.2 | 3% |
| (9) | Al/Si dual | 5/0.03 | No peel | All peel | 0 | 23.8 | 8% |
| (10) | Al/Si dual | 0.7/0.1 | No peel | No peel | 0 | 1.6 | 45% |
| (11) | Al-9% Si hot dip | 7 | No peel | Partial | 1.5 | 7.3 | 36% |
| (12) | Al-6% Si single vapor deposit | 5 | No peel | Partial | 0 | 6.4 | 36% |

Parenthesized run numbers represent Comparative Examples.

It is noted from Table 10 that the specimens with a double-layered plating which pertain to the present invention are superior in adhesion, heat resistance, and corrosion resistance, whereas the comparative specimen with an Al plating formed by hot dipping in run No. 11 is poor in adhesion and corrosion resistance after heating despite the considerably large amount of Si added. Moreover, the comparative specimens in run Nos. 9 and 10 which do not meet the requirements of the present invention are poor in adhesion or corrosion resistance after heating. The specimen in run No. 12 which has a single-layer plating of Al-6% Si alloy is poor in heat resistance and it becomes considerably poor in corrosion resistance after heat treatment.

Example 13

Cold rolled steel sheets measuring 100×100×0.8 mm were used as substrate metals after degreasing and rinsing. The substrate steel sheet was subjected to first vapor deposition with Cu in a vacuum of 10$^{-3}$ Torr or below under proper conditions which give a desired layer thickness. The substrate steel sheet was further subjected to second vapor deposition with Al or an Al alloy under proper conditions which give a desired layer thickness. Thus there were obtained steel sheets with two deposited layers as shown in Table 11. The specimens were tested for adhesion, heat resistance, and corrosion resistance. The test methods are given below. The results are shown in Table 11. The results are also compared with those of the conventional steel sheet with an Al plating formed by hot dipping.

Adhesion of plating:

Judged by observing whether or not the plating layer peels off when the specimen is bent 180° before and after heat treatment at 450° C. for 5 hours.

Corrosion resistance:

Judged according to the ratio of the occurrence of red rust which is noticed when the specimen is dipped in 1% ammonium chloride solution at 90° C. for 2 days after heat treatment at 450° C. for 5 hours.

Heat resistance:

Judged by measuring the thickness of the layer of Al-Fe intermetallic compounds under a microscope before and after heat treatment at 450° C. for 5 hours.

TABLE 11

| Run No. | Plating structure | Plating thickness (μm) | Plating adhesion (as-plated) | Plating adhesion (after heating) | Alloy layer thickness (g/m$^2$) (as-plated) | Alloy layer thickness (g/m$^2$) (after heating) | Ratio of red rust occurrence after corrosion test |
|---|---|---|---|---|---|---|---|
| 1 | Al/Cu dual | 5/0.1 | No peel | No peel | 0 | 1.0 | 5% |
| 2 | Al/Cu dual | 1/1.5 | No peel | No peel | 0 | 0.6 | 10% |
| 3 | Al/Cu dual | 5/0.05 | No peel | No peel | 0 | 2.4 | 3% |
| 4 | Al/Cu dual | 2/0.1 | No peel | No peel | 0 | 1.1 | 6% |
| 5 | Al-12% Cr/Cu | 3/0.1 | No peel | No peel | 0 | 0.5 | 0% |
| 6 | Al-17% Mg/Cu | 3/0.3 | No peel | No peel | 0 | 1.1 | 2% |
| 7 | Al-6% Ti/Cu | 2/0.1 | No peel | No peel | 0 | 1.8 | 0% |
| 8 | Al-9% Sn/Cu | 4/0.3 | No peel | No peel | 0 | 1.0 | 3% |
| (9) | Al/Cu dual | 5/0.03 | No peel | All peel | 0 | 26.2 | 25% |
| (10) | Al/Cu dual | 0.7/0.1 | No peel | No peel | 0 | 1.6 | 50% |
| (11) | Al-9% Si hot dip | 7 | No peel | Partial | 1.5 | 7.3 | 38% |

Parenthesized run numbers represent Comparative Examples.

It is noted from Table 11 that the specimens with a double-layered plating which pertain to the present invention are superior in adhesion, heat resistance, and corrosion resistance, whereas the comparative specimen with an Al plating formed by hot dipping is poor in adhesion and corrosion resistance after heating. Moreover, the comparative specimens in run Nos. 9 and 10 which do not meet the requirements of the present invention are poor in adhesion or corrosion resistance after heating.

Example 14

Figure 11:
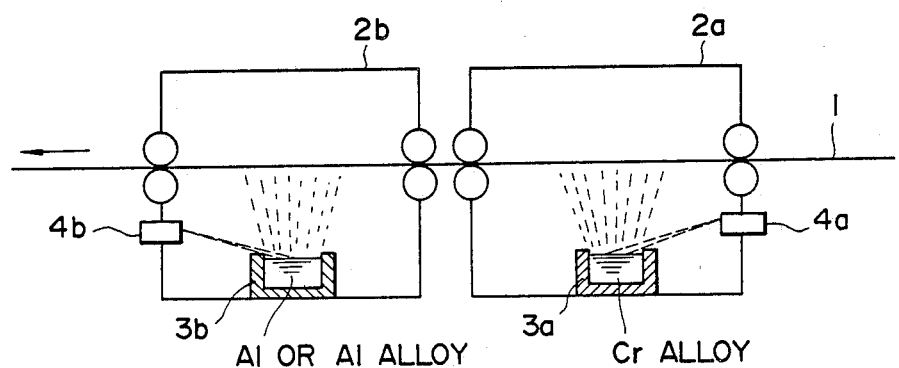
FIG. 11 is a schematic representation showing the process for producing the double-layer deposited steel sheet according to the present invention.

A steel sheet with a multilayered plating was produced by passing through a substrate (cold rolled steel sheet) through the vacuum chambers as shown in FIG. 11. The vacuum chamber 2a, which is kept at $1 \times 10^{-2}$ to $1 \times 10^{-5}$ Torr, is provided with a crucible 3a charged with a Cr alloy containing a ferrous metal. The Cr alloy is vaporized by heating with an electron beam so that a vapor deposited layer of Cr alloy is formed on the substrate steel sheet. Similarly, the vacuum chamber 2b, which is kept at $1 \times 10^{-2}$ to $1 \times 10^{-5}$ Torr, is provided with a crucible 3b charged with Al or an Al alloy. The Al or Al alloy is vaporized by heating with an electron beam so that a vapor deposited layer of Al or Al alloy is formed on the vapor deposited layer of Cr alloy. Several specimens were prepared, with the composition of the Cr alloy changed and the thickness of the Al deposited layer changed. The thus prepared specimens were tested for heat resistance, corrosion resistance, and formability. The results are shown in Table 12. It is noted from Table 12 that the steel sheets with multiple deposited layers are superior in heat resistance, corrosion resistance, and formability.

The following methods were used to test and evaluate the heat resistance, corrosion resistance, and formability.

Heat resistance:

Evaluated by measuring the weight gain by oxidation which results from heat treatment in the air at 600° C. for 400 hours.

Corrosion resistance:

Evaluated by measuring the weight loss by corrosion according to the muffler corrosion test (Walker Test).

Formability:

The specimen with its center jutted out 5 mm using an Ericksen tester undergoes heat treatment at 400° C. for 6 hours, and the plating at the jutted part is subjected to peel test with an adhesive tape.

TABLE 12

| Run No. | Ferrous metal in Cr alloy layer (%) | Thickness of Cr alloy layer (μm) | Thickness of Al layer (μm) | Heat resistance | Corrosion resistance | Formability |
| --- | --- | --- | --- | --- | --- | --- |
| 1 | Ni (1) | 2 | 6 | Good | Good | Good |
| 2 | Ni (20) | 2 | 6 | Good | Good | Good |
| 3 | Ni (50) | 0.5 | 6 | Good | Good | Good |
| 4 | Co (20) | 2 | 6 | Good | Good | Good |
| 5 | Fe (20) | 2 | 6 | Good | Good | Good |
| 6 | Fe (10) Ni (10) | 3 | 6 | Good | Good | Good |
| 7 | Ni (10) | 0.1 | 6 (Cr 10%) | Good | Good | Good |
| (1) | — | 2 | 6 | Good | Fair | Poor |
| (2) | Ni (0.5) | 2 | 6 | Good | Fair | Poor |
| (3) | Ni (60) | 2 | 6 | Good | Poor | Fair |
| (4) | * | * | * | Poor | Fair | Poor |
| (5) | ** | ** | ** | Fair | Poor | Poor |
| (6) | Ni (20) | 0.08 | 6 | Poor | Poor | Fair |

Parenthesized run numbers represent Comparative Examples.
*Vapor deposited Al.
**Hot dip Al (Si 9%)

Example 15

Cold rolled steel sheets measuring $100 \times 100 \times 0.6$ mm were used as substrate metals after alkali degreasing and rinsing. The substrate steel sheet was subjected to first vapor deposition with Al and Si vaporized from separate vessels in a vacuum of $10^{-3}$ Torr or below under proper conditions which give a desired layer thickness. The substrate steel sheet was further subjected to second vapor deposition with Al or an Al alloy under the same conditions as above. Thus there were obtained steel sheets with two deposited layers. The specimens were tested for adhesion between the first and second deposited layers and also for the first layer's effect of preventing the formation of Al-Fe intermetallic compounds. The test methods are given below. The results are shown in Table 11.

Adhesion of plating:

Judged by tape peeling test.

Heat resistance:

Judged by measuring the thickness of the layer of Al-Fe intermetallic compounds under a microscope after heating in the air at 450° C. for 15 hours.

TABLE 13

| Run No. | Composition of lower layer | Thickness of lower layer (μm) | Composition of upper layer | Thickness of upper layer (μm) | Adhesion between lower layer and upper layer | Prevention of Al—Fe intermetallic compounds |
| --- | --- | --- | --- | --- | --- | --- |
| 1 | Al-10% Si | 0.5 | pure Al | 5 | Good | Fair |
| 2 | Al-30% Si | 0.3 | pure Al | 3 | Good | Fair |
| 3 | Al-50% Si | 0.2 | pure Al | 3 | Fair | Good |
| 4 | Al-90% Si | 0.1 | pure Al | 2 | Fair | Good |
| 5 | Al-60% Si | 0.3 | Al-10% Cr | 5 | Fair | Good |
| (6) | Al-6% Si | 0.5 | pure Al | 3 | Good | Poor |
| (7) | Al-50% Si | 0.04 | pure Al | 5 | Fair | Bad |
| (8) | Al-95% Si | 0.2 | pure Al | 5 | Bad | Good |
| (9) | Al-95% Si | 0.05 | Al-20% Ti | 3 | Poor | Poor |

Parenthesized run numbers represent Comparative Examples.

It is noted from Table 13 that the specimens in run Nos. 1 to 5, which meet the requirements of the present invention, provide good adhesion between the lower and upper layers and also produce the good effect of preventing the formation of Al-Fe intermetallic compounds. By contrast, the specimen in run No. 6 does not produce the effect of preventing the formation of Al-Fe intermetallic compounds because it has the lower layer which is made of an Al-Si alloy containing less than 10% of Si. The specimen in run No. 7 does not produce the effect of preventing the formation of Al-Fe intermetallic compounds because it has the lower layer which is excessively thin. In the case of the specimen in run No. 8, the adhesion between the lower and upper layers is poor because the lower layer is made of an Al-Si alloy containing more than 90% of Si. The specimen in run No. 9, which has the upper layer made of an Al-20% Ti alloy, does not produce the effect of preventing the formation of Al-Fe intermetallic compounds because the lower layer made of Al-Si alloy is excessively thin.

Example 16

Cold rolled steel sheets which had been degreased and rinsed were provided with two vapor deposited layers in the same manner as in Example 15. The specimens were tested for heat resistance in the following manner. The results are shown in Table 14. For reference, the results are also compared with those of a steel sheet provided with a plating of Al (9% Si) formed by hot dipping.

Heat resistance test:

The specimen undergoes three cycles of heat treatment, each cycle consisting of heating at 450° C. for 5 hours in the atmosphere and air cooling. Heat resistance is judged by measuring the amount of Al-Fe intermetallic compound formed between the substrate steel sheet and the lower layer before and after the heat treatment.

Corrosion resistance:

The specimen undergoes salt spray test. Corrosion resistance is judged by measuring the time required for red rust to occur on the substrate steel sheet.

mens in run Nos. 9 and 10 are poor in corrosion resistance because their upper layer is too thin. The specimen in run No. 11 is one which is prepared by conventional hot dipping with Al. It is poor in heat resistance as indicated by the formation of a large amount of Al-Fe intermetallic compounds at the interface between the substrate steel sheet and the plating layer, although the plating aluminum contains 9% of Si for the prevention of Al-Fe intermetallic compounds.

Example 17

Cold rolled steel sheets (100 mm wide and 0.7 mm thick) which had undergone electrolytic alkali degreasing and rinsing and then surface activation pretreatment by Ar ion sputtering in a vacuum chamber were used as the substrate steel sheets. After preheating at 300°~400° C., the substrate steel sheet was provided with a multilayered vapor deposit of Al and Cr having a desired layer thickness and layer structure according to the process as shown in FIG. 8. The plated steel sheets thus obtained were tested for performance in the following manner. For the purpose of comparison, plated steel sheets were prepared by hot dipping with Al (9% Si), vapor deposition of pure Al, and vapor deposition of Al and Cr for double-layer structure. Also evaluated was a steel sheet with a triple-layer plating which is outside the scope of the present invention.

Experiment A:

The specimens obtained in this example were tested for heat resistance and formability in the following manner. The results are shown in Table 15.

Heat resistance test:

TABLE 14

| Run No. | Lower layer Composition | Thickness (μm) | Upper layer Composition | Thickness (μm) | Heat resistance* (as-plated) (g/cm²) | (after heat treatment) (g/cm²) | Corrosion resistance Time for red rust to occur (h) |
|---|---|---|---|---|---|---|---|
| 1 | Al-30% Si | 0.3 | pure Al | 6 | 0 | 1.4 | 240 |
| 2 | Al-30% Si | 0.3 | Al-10% Cr | 5 | 0 | 1.5 | 600 |
| 3 | Al-50% Si | 0.2 | Al-20% Ti | 3 | 0 | 1.0 | 540 |
| 4 | Al-90% Si | 0.1 | Al-30% Mg | 6 | 0 | 0.8 | 350 |
| 5 | Al-10% Si | 0.5 | Al-35% Sn | 5 | 0 | 2.2 | 280 |
| 6 | Al-60% Si | 0.3 | Al-10% Cr -5% Ti | 6 | 0 | 0.9 | 720 |
| (7) | Al-6% Si | 0.3 | pure Al | 5 | 0 | 7.3 | 200 |
| (8) | Al-95% Si | 0.05 | pure Al | 5 | 0 | 5.6 | 180 |
| (9) | Al-30% Si | 0.3 | Al-10% Cr | 0.6 | 0 | 1.4 | 140 |
| (10) | Al-50% Si | 0.2 | Al-6% Mg | 0.5 | 0 | 0.9 | 90 |
| (11) | Hot dip Al (9% Si) | 7 | — | — | 1.5 | 29.3 | 200 |

Parenthesized run numbers represent Comparative Examples.
*Indicated by the thickness of the layer of Al—Fe intermetallic compounds formed after the heat resistance test.

It is noted from Table 14 that the specimens in run Nos. 1 to 6 which meet the requirements of the present invention are superior in both heat resistance and corrosion resistance. By contrast, the specimen in run No. 7 is poor in heat resistance (or in the effect of preventing the formation of Al-Fe intermetallic compounds) because its lower layer is made of an Al-Si alloy containing only a small amount of Si. The specimen in run No. 8 is poor in heat resistance because its lower layer of Al-Si alloy is so thin that it does not prevent the formation of Al-Fe intermetallic compounds resulting from the mutual diffusion between the substrate steel sheet and the upper layer, although the lower layer contains a large amount of Si. In addition, the excessive amount (90%) of Si adversely affects the corrosion resistance. The speci- The specimen undergoes three cycles of heat treatment, each cycle consisting of heating at 600° C. for 5 hours in the atmosphere and air cooling for 19 hours. The cross section of the specimen is examined under a microscope to see the formation of Fe-Al intermetallic compounds before and after the heat treatment.

Heat resistance in Table 15 is ranked as follows:
Good: Very effective in preventing the formation and growth of Fe-Al intermetallic compounds.
Fair: Effective in preventing the formation and growth of Fe-Al intermetallic compounds.
Poor: Slightly effective in preventing the formation and growth of Fe-Al intermetallic compounds.

Bad: Not effective in preventing the formation and growth of Fe-Al intermetallic compounds.

Formability test:

Judged by measuring the plating weight which is peeled off by an adhesive tape stuck to the apex of the 180° bent specimen. Formability in Table 15 is ranked as follows:
Good: Very good adhesion of plating.
Fair: Good adhesion of plating.
Poor: Poor adhesion of plating.
Bad: Very poor adhesion of plating.

TABLE 15

| Run No. | Thickness of plating layers (μm) | | | | Heat resistance | Formability | Remarks |
|---|---|---|---|---|---|---|---|
| | Lower layer (Cr) | Inter layer (Al—Cr alloy) | Upper layer (Al) | Total | | | |
| (1) | — | — | 6.0 | 6.0 | Bad | Good | V.D.* |
| (2) | 0.05 | — | 6.0 | 6.05 | Poor | Poor | V.D. |
| (3) | 4.0 | — | 2.0 | 6.0 | Good | Bad | V.D. |
| 4 | 0.2 | 0.05 | 5.0 | 5.25 | Fair | Fair | V.D. |
| 5 | 1.0 | 0.1 | 5.0 | 6.1 | Fair | Good | V.D. |
| 6 | 2.0 | 0.2 | 4.0 | 6.2 | Good | Good | V.D. |
| 7 | 2.5 | 0.5 | 3.0 | 6.0 | Good | Good | V.D. |
| (8) | 0.05 | 0.01 | 6.0 | 6.06 | Poor | Poor | V.D. |
| (9) | 1.0 | 0.02 | 5.5 | 6.52 | Fair | Poor | V.D. |
| (10) | 4.0 | 0.5 | 2 | 6.5 | Good | Bad | V.D. |
| (11) | Hot dipping, Al (9% Si) | | | 7.2 | Bad | Poor | H.D.** |

Parenthesized run numbers represent Comparative Examples.
*Vapor deposition.
**Hot dipping.

Fe-Al-Si intermetallic compounds which have occurred at the time of production.

Experiment B:

The specimens obtained in this example were tested for corrosion resistance in the following manner. The results are shown in Table 16.

Corrosion resistance test:

The specimen (measuring 70×150 mm), with the edges and back sealed with a tape, was subjected to salt spray test with a 5% NaCl solution, and corrosion resistance was judged by measuring the time required for red rust to cover 5% of the surface area. Among from the specimens which had undergone the corrosion resistance test were selected specimens for another corrosion resistance test after forming. The selected specimen was given a jut (7 mm high from the back side of the steel sheet) by an Ericksen tester and then subjected to salt spray test. Corrosion resistance was judged by measuring the time required for red rust to cover 5% of the surface area and comparing the time with that measured in the case where no jut was made.

In Table 16, corrosion resistance after forming is ranked as follows:
Good: Corrosion resistance is comparable to that of the specimen with no forming.
Fair: Corrosion resistance is slightly inferior to that of the specimen with no forming.
Poor: Corrosion resistance is inferior to that of the specimen with no forming.

TABLE 16

| Run No. | Thickness of plating layers (μm) | | | | Corrosion resistance (h)*** | Corrosion resistance after forming | Remarks |
|---|---|---|---|---|---|---|---|
| | Lower layer (Cr) | Inter layer (Al—Cr alloy) | Upper layer (Al) | Total | | | |
| (1) | — | — | 6.0 | 6.0 | 200 | — | V.D.* |
| (2) | 0.05 | — | 6.0 | 6.05 | 230 | — | V.D. |
| (3) | 4.0 | — | 2.0 | 6.0 | 180 | Poor | V.D. |
| 4 | 0.2 | 0.05 | 5.0 | 5.25 | 720 | — | V.D. |
| 5 | 1.0 | 0.1 | 5.0 | 6.1 | >1000 | Good | V.D. |
| 6 | 2.0 | 0.2 | 4.0 | 6.2 | >1000 | Good | V.D. |
| (7) | 0.05 | 0.01 | 6.0 | 6.06 | 540 | Fair | V.D. |
| (8) | 4.0 | 0.9 | 2.0 | 6.5 | 450 | Poor | V.D. |
| (9) | Hot dipping, Al (9% Si) | | | 7.4 | 240 | Fair | H.D.** |

Parenthesized run numbers represent Comparative Examples.
*Vapor deposition.
**Hot dipping.
***in terms of time required for red rust to cover 5% of surface area.

It is noted from Table 15 that the specimens in run Nos. 4 to 7 which pertains to the present invention are superior in both heat resistance and formability (adhesion of plating). By contrast, the specimen in run No. 1 which has vapor deposited layer of pure Al is satisfactory in adhesion but considerably inferior in heat resistance. The specimens in run Nos. 2 and 3 which have two plating layers of Al (upper layer) and Cr (lower layer) have improved heat resistance only at the sacrifice of form-ability when the lower layer (Cr) is made thicker. The comparative specimens in run Nos. 8 and 9 which have three layers like the specimens pertaining to the present invention do not suffice both heat resistance and formability, because the thickness of each plating layer is not adequate. The specimen in run No. 11 which has a plated layer formed by conventional hot dipping with Al (9% Si) is apparently insufficient in heat resistance as well as formability on account of Fe-Al or It is noted from Table 16 that the specimens in run Nos. 4 to 6 which pertain to the present invention are superior in corrosion resistance and retains the outstanding corrosion resistance even after forming. By contrast, the specimen in run No. 1 which has vapor deposit of pure Al is poor in corrosion resistance and the specimens in run Nos. 2 and 3 which have two plating layers of vapor deposited Al (upper layer) and Cr (lower layer) are also poor in corrosion resistance. This suggests that the thicker Cr layer is poor in formability and liable to cracking which promotes corrosion. The comparative specimens in run Nos. 7 and 8 have somewhat improved corrosion resistance but are poor in corrosion resistance after forming because the Al-Cr alloy layer is not sufficiently thick (run No. 7) or the Cr layer is excessively thick. The specimen in run No. 9 which has a plated layer formed by conventional Al hot dipping is apparently insufficient in corrosion resistance despite the chromate treatment for the improvement of corrosion resistance.

Example 18

Cold rolled steel sheets (measuring 100×100×0.6 mm) which had been degreased with an alkaline solution, rinsed, and dried were used as substrate metals. The substrate steel sheet was provided with an Al-Cr-Si alloy plating by vapor deposition of Al, Cr, and Si individually heated by electron beams in a vacuum chamber at 1×10$^{-4}$ Torr. The resulting steel sheet with a vapor deposited Al-Cr-Si alloy layer was examined for heat resistance and corrosion resistance.

Heat resistance was evaluated by measuring the layer of Al-Fe intermetallic compounds which occurred after three cycles of heat treatment, each cycle consisting of heating at 450° C. for 5 hours in the atmosphere.

Corrosion resistance was evaluated by measuring the time required for red rust to occur on the substrate steel sheet in the salt spray test.

For comparison, the same test as above was performed on a steel sheet with a deposited layer of pure Al and a steel sheet with an Al-Si alloy layer formed by hot dipping. The results are shown in Table 17.

TABLE 17

| Run No. | Cr in deposit layer (%) | Si in deposit layer (%) | Thickness of deposit layer (μm) | Thickness of Al—Fe alloy layer (as plated) (g/m$^2$) | Thickness of Al—Fe alloy layer (after heating) (g/m$^2$) | Time for red rust to occur (h) |
|---|---|---|---|---|---|---|
| 1 | 15 | 1 | 5 | 0 | 56 | 620 |
| 2 | 15 | 3 | 5 | 0 | 32 | 608 |
| 3 | 15 | 5 | 5 | 0 | 20 | 596 |
| 4 | 15 | 10 | 5 | 0 | 16 | 572 |
| 5 | 15 | 20 | 5 | 0 | 9 | 520 |
| 6 | 5 | 5 | 6 | 0 | 22 | 460 |
| 7 | 10 | 5 | 6 | 0 | 20 | 508 |
| 8 | 30 | 5 | 6 | 0 | 17 | 706 |
| 8 | 50 | 5 | 6 | 0 | 12 | 442 |
| (10) | — | 20 | 6 | 0 | 10 | 165 |
| (11) | 15 | — | 5 | 0 | 76 | 632 |
| (12) | 15 | 40 | 5 | 0 | 8 | 202 |
| (13) | 0.7 | 10 | 6 | 0 | 17 | 195 |
| (14) | Pure Al vapor deposit | | 6 | 0 | 83 | 230 |
| (15)* | Hot dip Al (9% Si) | | 7 | 1.5 | 16 | 260 |
| (16)** | Hot dip Al (9% Si) | | 6 | 1.3 | 17 | 192 |

Parenthesized run numbers represent Comparative Examples.
*with chromate treatment.
**without chromate treatment.

It is noted from Table 17 that the steel sheets provided with an Al-Cr-Si vapor deposited layer according to the present invention are superior in both heat resistance and corrosion resistance, whereas the comparative steel sheet with an Al-Si alloy layer formed by hot dipping is not satisfactory in corrosion resistance and the comparative steel sheets with an Al alloy deposited layer are satisfactory only in either heat resistance or corrosion resistance.

Example 19

Figure 12:
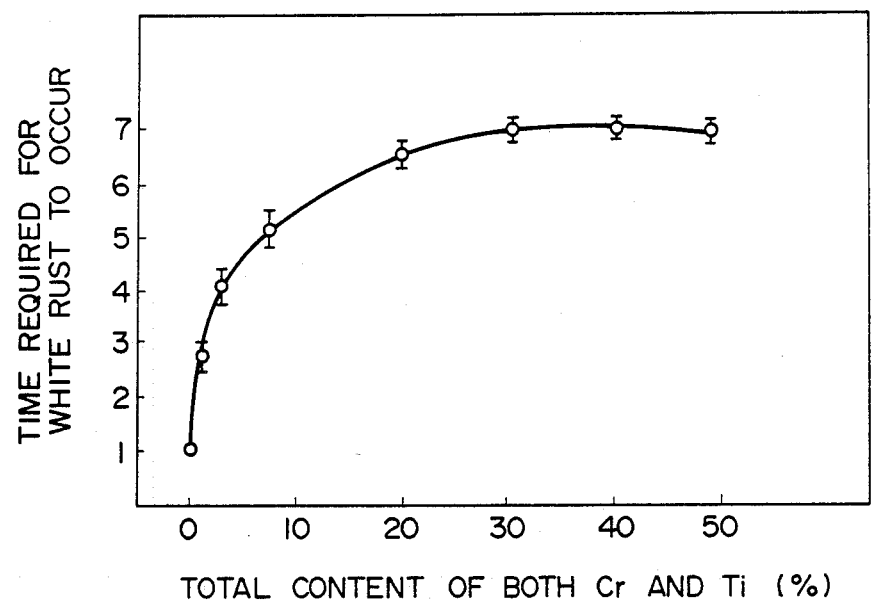
FIG. 12 is a graph showing the relation between the total content of Cr and Ti and the time required for white rust to occur.

Experiment C:

Steel sheets (measuring 100×150×0.6 mm) which had undergone electrolytic degreasing with an alkaline solution, rinsing, and drying were provided with an Al-Cr-Ti alloy plating by vapor deposition of Al, Cr, and Ti individually heated by electron beams in a vacuum chamber. The plated steel sheets with a 5-μm thick Al-Cr-Ti alloy deposited layer were examined for corrosion resistance by salt spray test, and the time required for white rust to occur was plotted against the content of Cr and Ti, as shown in FIG. 12. (The time required for white rust to occur in the case of pure Al deposited layer is the index number 1.) It is noted from FIG. 12 that corrosion resistance is greatly improved when the total content of Cr and Ti exceeds 1%.

Figure 13:
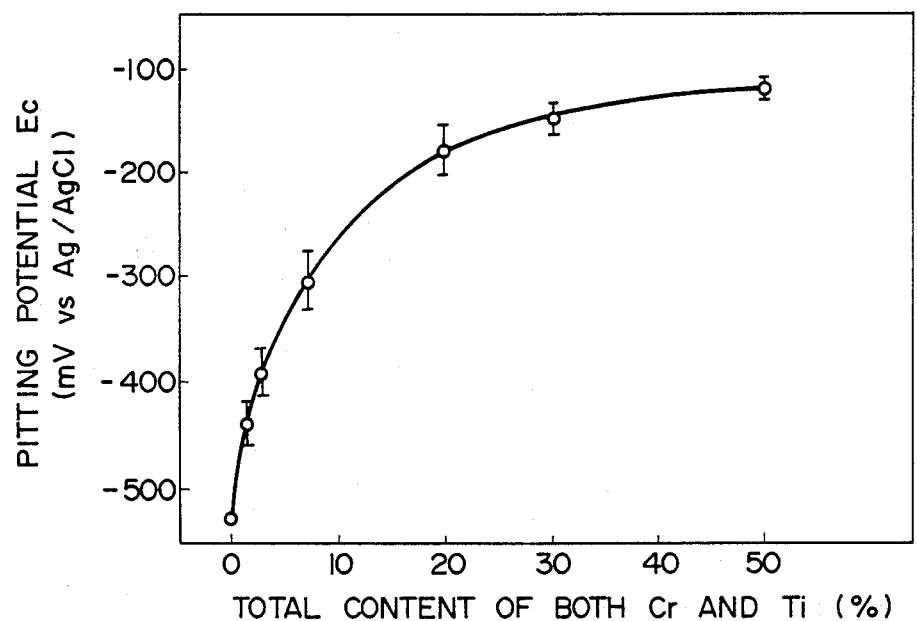
FIG. 13 is a graph showing the relation between the total content of Cr and Ti and the pitting potential (Ec).

Experiment D:

Aluminum alloy sheets (1 mm thick) were provided with a 6-μm thick Al-Cr-Ti alloy layer in the same manner as in Experiment C. The specimens were immersed in a 2% citric acid solution containing 100 ppm of chloride ions (of NaCl) at 25° C., and the pitting potential (Ec) of the deposited layer was measured according to the potentiostatic anodic polarization method. The relation between the pitting potential (Ec) and the total content of Cr and Ti is shown in FIG. 13. It is noted from FIG. 13 that the pitting potential (Ec) of the Al-Cr-Ti deposited layer is nobler than that of the pure Al deposited layer (without Cr and Ti) when the total content of Cr and Ti exceeds 1%.

Figure 14:
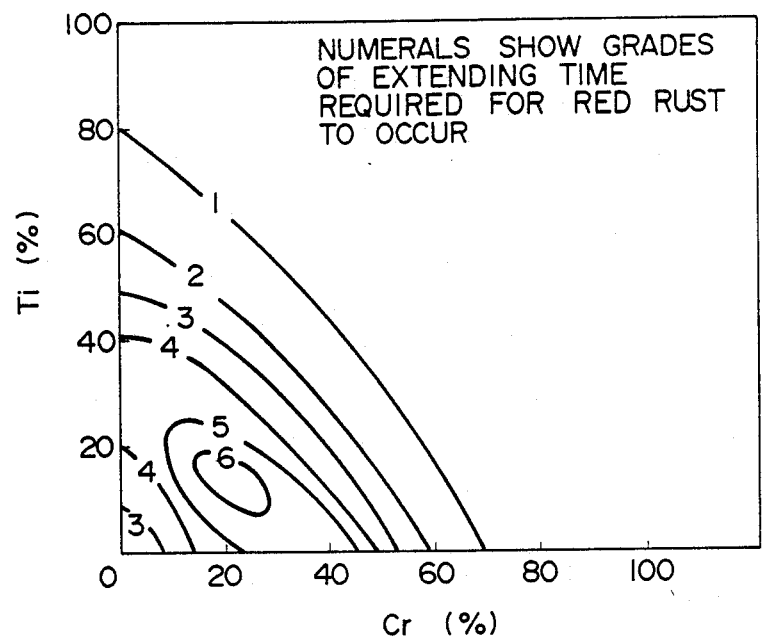
FIG. 14 is a graph showing the effect of adding Cr and Ti together on the time required for red rust to occur.

Experiment E:

Cold rolled steel sheets were provided with a 5-μm thick Al-Cr-Ti alloy plating by vapor deposition in the same manner as in Experiment C. The plated steel sheets were examined for corrosion resistance by salt spray test, and the time required for red rust to occur was plotted against the content of Cr and Ti, as shown in FIG. 14. (The time required for red rust to occur in the case of pure Al deposited layer is the index number 1.) It is noted from FIG. 14 that corrosion resistance is by far better in the case where the alloy contains both Cr and Ti than in the case where the alloy contains Cr alone. The effect of Cr and Ti levels off when their total content exceeds 50%.

Figure 15:
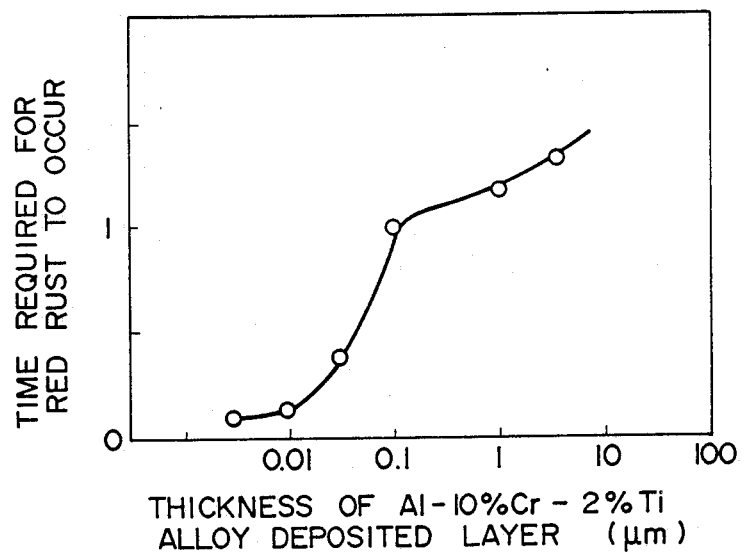
FIG. 15 is a graph shown the relation between the deposit layer thickness and the time required for red rust to occur.

Experiment F:

Steel sheets were provided with an Al-10% Cr-2% Ti alloy deposited layer of varied thickness in the same manner as in Experiment C. The plated steel sheets were examined for corrosion resistance by salt spray test, and the time required for red rust to occur was plotted against the thickness of the deposited layer, as shown in FIG. 15. (The time required for red rust to occur in the case where the deposited layer is 0.1 μm thick is the index number 1.) It is noted from FIG. 15 that corrosion resistance is improved in proportion to the layer thickness up to 0.1 μm, and the improvement becomes less significant when the layer thickness exceeds 0.1 μm. This suggests that the preferred layer thickness is a little over 1 μm.

Example 20

Cold rolled steel sheets which had been degreased with an alkaline solution and dried were used as substrate metals. The steel sheets were provided with a deposited layer of multi-component alloy composed of Al, Cr, and ferrous metal(s). The steel sheets with a deposited layer were examined for heat resistance and corrosion resistance in the following manner. The results are shown in Table 18.

Heat resistance: Evaluated by measuring the weight gain by oxidation which results from heat treatment in the air at 600° C. for 400 hours.

Corrosion resistance: Evaluated by measuring the weight loss by corrosion according to the muffler corrosion test (Walker Test).

It is noted from Table 18 that the steel sheets with an Al-alloy deposited layer which meet the requirements of the present invention are superior in heat resistance and corrosion resistance.

TABLE 18

| Run No. | Cr content in deposit layer (%) | Ferrous metal in deposit layer | Content of ferrous metal (%) | Thickness of deposit layer (μm) | Heat resistance | Corrosion resistance |
|---|---|---|---|---|---|---|
| 1 | 15 | Ni | 1 | 5 | Good | Good |
| 2 | 15 | Ni | 5 | 5 | Good | Good |
| 3 | 15 | Ni | 20 | 5 | Good | Good |
| 4 | 5 | Co | 10 | 6 | Good | Good |
| 5 | 10 | Fe | 10 | 5 | Good | Good |
| 6 | 15 | Fe Ni | 10 10 | 5 | Good | Good |
| 7 | 40 | Ni Co | 5 5 | 6 | Good | Good |
| 8 | 15 | Fe Co Ni | 5 5 5 | 5 | Good | Good |
| 9 | 15 | Ni | 20 | 0.1 | Good | Good |
| (1) | — | Ni | 10 | 5 | Fair | Fair |
| (2) | 15 | Ni | 0.5 | 5 | Fair | Fair |
| (3) | 15 | Ni | 40 | 6 | Good | Poor |
| (4) | 0.5 | Ni | 10 | 5 | Fair | Fair |
| (5) | 15 | Fe Ni | 15 15 | 5 | Fair | Poor |
| (6) | 15 | Fe Ni Co | 10 10 10 | 6 | Fair | Poor |
| (7) | 15 | Ni | 20 | 0.08 | Poor | Poor |
| (8) | Pure Al vapor deposition | | | 7 | Poor | Fair |
| (9) | Hot dipping Al (9% Si) | | | 6 | Fair | Poor |

Parenthesized run numbers represent Comparative Examples.

What is claimed is:

1. An Al-Cr alloy vapor deposited product having high corrosion resistance which comprises a substrate metal and an Al-Cr alloy layer deposited on said substrate metal, wherein said substrate metal was heated to about 100° to 450° C. during the vapor deposition step, said alloy consisting essentially of Al, Cr, and θ phase $Al_{13}Cr_2$ wherein said alloy contains 1 to 50 wt % of Cr.

2. An Al-Cr alloy vapor deposited product having high corrosion resistance according to claim 1, wherein the Al-Cr alloy deposited layer contains 1 to 30 wt % of chromium and consists essentially of Al, Cr, and θ phase ($Al_{13}Cr_2$).

3. An Al-Cr alloy vapor deposited product having high corrosion resistance according to claim 1 or 2, wherein the Al-Cr alloy deposited layer contains chromium whose content gradually decreases with distance across the thickness of the layer such that the Cr content is minimum at the interface between the layer and the substrate metal.

4. An Al-Cr alloy vapor deposited product having high corrosion resistance according to claim 1 or 2, wherein the Al-Cr alloy deposited layer contains chromium whose content gradually increases with distance across the thickness of the layer such that the Cr content is maximum at the interface between the layer and the substrate metal.

5. An Al-Cr alloy vapor deposited product, having high corrosion resistance according to claims 1 or 2, wherein the Al-Cr alloy deposited layer is formed as a second layer on a pre-plated layer formed as a first layer on the substrate metal.

6. An Al-Cr alloy vapor deposited product having high corrosion resistance according to claim 5, wherein the first layer is a Si deposited layer.

7. An Al-Cr alloy vapor deposited product having high corrosion resistance according to claim 5, wherein the first layer is a Cu deposited layer.

8. An Al-Cr alloy vapor deposited product having high corrosion resistance according to claim 5, wherein the first layer is an Al-Si alloy deposited layer containing 10 to 90 wt % of Si, with the balance being substantially Al.

9. An Al-Cr alloy vapor deposited product having high corrosion resistance according to claim 5, wherein the first layer is an Al deposited layer.

10. An Al-Cr alloy vapor deposited product having high corrosion resistance according to claim 5, wherein the first layer is a Cr alloy deposited layer containing 1 to 50 wt % of at least one element selected from the group consisting of Fe, Co and Ni, with the balance consisting essentially of Cr.

11. An Al-Cr alloy vapor deposited product having high corrosion resistance according to claims 1 or 2, wherein the Al-Cr alloy deposited layer is formed as a second layer on a Cr deposited layer formed as a first layer on the substrate metal, and the second layer is covered with an Al deposited layer as the top layer.

12. An Al-Cr alloy vapor deposited product having high corrosion resistance which comprises a substrate metal and a ternary Al alloy layer of multi-component Al alloy layer deposited on said substrate metal, wherein said substrate metal was heated to about 100° to 450° C. during the vapor deposition step, said alloy containing 1 to 50 wt % of Cr and a third component metal selected from the group consisting of Si, Ti, Fe, Co and Ni.

13. An Al-Cr alloy vapor deposited product having high corrosion resistance according to claim 12, wherein the Al-Cr alloy deposited layer contains 1 to 20 wt % of Si as the third component metal.

14. An Al-Cr alloy vapor deposited product having high corrosion resistance according to claim 12, wherein the Al-Cr alloy deposited layer contains 1 to 49 wt % of Cr and 1 to 49 wt % of Ti as the third component metal, with the total content of Cr and Ti being 2 to 50 wt %.

15. An Al-Cr alloy vapor deposited product having high corrosion resistance according to claim 12, wherein Al-Cr alloy deposited layer contains 1 to 20 wt % of at least one element selected from the group consisting of Fe, Co and Ni as the third component metal.

* * * * *

UNITED STATES PATENT AND TRADEMARK OFFICE
CERTIFICATE OF CORRECTION

PATENT NO. : 4,963,440
DATED : OCTOBER 16, 1990
INVENTOR(S) : KAZUTOSHI SHIMOGORI ET AL.

It is certified that error appears in the above-identified patent and that said Letters Patent is hereby corrected as shown below:

On the title page, item [30]:

Please delete the following listed under the Foreign Application Priority Data:

"Jul. 9, 1987 Japan ..................62-171661"
"Jul. 9, 1987 Japan ................62-171659"
"Jul 9, 1987 Japan ..................62-171660"
"Jul. 15, 1987 Japan ...............62-177832"
"Jul. 15, 1987 Japan ...............62-177829"
"Jul. 15, 1987 Japan ...............62-177830"
"Jul. 15, 1987 Japan ...............62-177831"
"Oct. 8, 1987 Japan ...............62-255493"
"Nov. 9, 1987 Japan ...............62-282827".

Signed and Sealed this

Seventeenth Day of November, 1992

Attest:

DOUGLAS B. COMER

*Attesting Officer*     *Acting Commissioner of Patents and Trademarks*